(12) United States Patent
Moon et al.

(10) Patent No.: US 11,984,539 B2
(45) Date of Patent: May 14, 2024

(54) LIGHT-EMITTING ELEMENT, MANUFACTURING METHOD THEREFOR, AND DISPLAY DEVICE HAVING LIGHT-EMITTING ELEMENT

(71) Applicant: SAMSUNG DISPLAY CO., LTD., Yongin-si (KR)

(72) Inventors: Su Mi Moon, Yongin-si (KR); Eun Ju Kim, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 428 days.

(21) Appl. No.: 17/297,870

(22) PCT Filed: Jun. 20, 2019

(86) PCT No.: PCT/KR2019/007465
§ 371 (c)(1),
(2) Date: May 27, 2021

(87) PCT Pub. No.: WO2020/111425
PCT Pub. Date: Jun. 4, 2020

(65) Prior Publication Data
US 2022/0037562 A1    Feb. 3, 2022

(30) Foreign Application Priority Data
Nov. 27, 2018  (KR) .................. 10-2018-0148788

(51) Int. Cl.
*H01L 33/44* (2010.01)
*H01L 25/16* (2023.01)
(Continued)

(52) U.S. Cl.
CPC ............ *H01L 33/44* (2013.01); *H01L 25/167* (2013.01); *H01L 33/0062* (2013.01);
(Continued)

(58) Field of Classification Search
CPC ... H01L 33/44; H01L 25/167; H01L 33/0062; H01L 33/0066; H01L 33/24;
(Continued)

(56) References Cited

U.S. PATENT DOCUMENTS 7,772,587 B2   8/2010  Kim et al.
8,872,214 B2  10/2014  Negishi et al.
(Continued)

FOREIGN PATENT DOCUMENTS

CN   101589349   11/2009
CN   107408603   11/2017
(Continued)

OTHER PUBLICATIONS

International Search Report, with English translation, corresponding to International Application No. PCT/KR2019/007465 dated Oct. 4, 2019.
(Continued)

*Primary Examiner* — J. E. Schoenholtz
(74) *Attorney, Agent, or Firm* — KILE PARK REED & HOUTTEMAN PLLC

(57) ABSTRACT

A light emitting element includes an emission stacked pattern and an insulating film. The emission stack pattern includes a first conductive semiconductor layer, an active layer disposed on the first conductive semiconductor layer, and a second conductive semiconductor layer disposed on the active layer. The insulating film surrounds an outer surface of the emission stacked pattern and has a non-uniform thickness.

19 Claims, 47 Drawing Sheets

(51) Int. Cl.
*H01L 33/00* (2010.01)
*H01L 33/24* (2010.01)

(52) U.S. Cl.
CPC .......... *H01L 33/0066* (2013.01); *H01L 33/24* (2013.01); *H01L 2933/0025* (2013.01)

(58) Field of Classification Search
CPC ......... H01L 2933/0025; H01L 25/0753; H01L 33/0095; H01L 33/20; H01L 27/156; H01L 33/005; H01L 33/54
See application file for complete search history.

(56) References Cited

U.S. PATENT DOCUMENTS

| | | | |
|---|---|---|---|
| 9,112,112 B2 | 8/2015 | Do et al. | |
| 9,159,882 B2 | 10/2015 | Hwang et al. | |
| 9,484,492 B2 | 11/2016 | Bour et al. | |
| 9,773,761 B2 | 9/2017 | Do | |
| 9,978,725 B2 | 5/2018 | Do | |
| 11,189,752 B2 * | 11/2021 | Daudin | H01L 33/34 |
| 11,728,464 B2 * | 8/2023 | Park | H01L 33/44 257/79 |
| 2006/0278886 A1 | 12/2006 | Tomoda et al. | |
| 2008/0160196 A1 | 7/2008 | Kim et al. | |
| 2008/0175104 A1 | 7/2008 | Grieb et al. | |
| 2011/0089850 A1 | 4/2011 | Shibata et al. | |
| 2015/0129834 A1 | 5/2015 | Cha et al. | |
| 2017/0133550 A1 * | 5/2017 | Schuele | H01L 25/167 |
| 2018/0175104 A1 | 6/2018 | Kang et al. | |
| 2018/0351037 A1 * | 12/2018 | Zhang | H01L 21/02387 |

FOREIGN PATENT DOCUMENTS

| | | |
|---|---|---|
| KR | 10-2007-0060970 | 6/2007 |
| KR | 10-2010-0054594 | 5/2010 |
| KR | 10-1244926 | 3/2013 |
| KR | 10-1391807 | 5/2014 |
| KR | 10-1429095 | 8/2014 |
| KR | 10-1490758 | 2/2015 |
| KR | 10-1682582 | 12/2016 |
| KR | 10-1721846 | 4/2017 |
| KR | 10-2017-0074296 | 6/2017 |
| KR | 10-1789123 | 10/2017 |
| KR | 10-2018-0058910 | 6/2018 |
| KR | 10-2020-0029100 | 3/2020 |
| WO | 2011/162715 | 12/2011 |

OTHER PUBLICATIONS

Written Opinion, with English translation, corresponding to International Application No. PCT/KR2019/007465, dated Oct. 4, 2019.

* cited by examiner

LIGHT-EMITTING ELEMENT, MANUFACTURING METHOD THEREFOR, AND DISPLAY DEVICE HAVING LIGHT-EMITTING ELEMENT

CROSS-REFERENCE TO RELATED APPLICATION(S)

This application is a national entry of International Application No. PCT/KR2019/007465, filed on Jun. 20, 2019, which claims under 35 U.S.C. § 119(a) and 365 (b) priority to and benefits of Korean Patent Application No. 10-2018-0148788, filed on Nov. 27, 2018 in the Korean Intellectual Property Office, the entire contents of which are incorporated herein by reference.

BACKGROUND

Technical Field

The disclosure herein relates to a light emitting element, and more particularly, to a subminiature light emitting element, a method of manufacturing the light emitting element, and a display device having the light emitting element.

Background Art

A light emitting diode (LED) may have relatively satisfactory durability even under poor environmental conditions and may have satisfactory performance in terms of lifetime and luminance. Research on the technology of applying such LEDs to various display devices has become more active.

Technologies for fabricating an LED having a small size ranging from a nanometer scale to a micrometer scale using an inorganic crystalline structure, e.g., a structure obtained by growing a nitride-based semiconductor, are being developed.

LEDs may be fabricated in a size small enough to form a pixel of a display panel, etc. After the LEDs are separately grown on a substrate, the grown LEDs may be separated and used to manufacture the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The embodiments are directed to a light emitting element configured to prevent adjacent light emitting elements from being agglomerated, a method of manufacturing the light emitting element, and a display device including the light emitting element.

According to an embodiment, a light emitting element may include an emission stacked pattern and an insulating film. The emission stacked pattern may include a first conductive semiconductor layer, an active layer disposed on the first conductive semiconductor layer, and a second conductive semiconductor layer disposed on the active layer. The insulating film may surround an outer surface of the emission stacked pattern, and may have a non-uniform thickness.

A shape of the outer surface of the emission stacked pattern may be different from a shape of an outer surface of the insulating film.

The emission stacked pattern may include the first conductive semiconductor layer, the active layer, and the second conductive semiconductor layer that are sequentially stacked, and the emission stacked pattern may have a rod shape. The outer surface of the insulating film may have an elliptical shape, a polygonal shape, or a shape having the elliptical shape and the polygonal shape.

The insulating film may include at least one protrusion on the outer surface of the insulating film.

A shape of the outer surface of the emission stacked pattern may be same as a shape of an outer surface of the insulating film.

The outer surface of the emission stacked pattern and the outer surface of the insulating film each may have a polygonal shape.

According to an embodiment, a method of manufacturing a light emitting element may include forming an emission stacked pattern having a rod shape on a substrate; forming an insulating film surrounding an outer surface of the emission stacked pattern, the insulating film having a non-uniform thickness; and separating the emission stacked pattern surrounded by the insulating film from the substrate to form light emitting elements.

The forming of the insulating film may include forming an insulating film pattern having an outer surface that has the same shape as a shape of the outer surface of the emission stacked pattern; and forming an insulating film having an outer surface that has a different shape from the shape of the outer surface of the emission stacked pattern by removing at least a portion of the insulating film pattern.

The forming of the insulating film may include forming the insulating film to have an outer surface having an elliptical shape, a polygonal shape, or a shape having the elliptical shape and the polygonal shape to surround a cylindrical outer surface of the emission stacked pattern.

The forming of the insulating film may include forming at least one protrusion on the outer surface of the insulating film.

The forming of the emission stacked pattern may include forming an emission stack by sequentially forming a first conductive semiconductor layer, an active layer, and a second conductive semiconductor layer on the substrate; forming first micro patterns on the emission stack; and forming emission stacked patterns by etching the emission stack along the first micro patterns and removing the first micro patterns.

The forming of the first micro patterns may include forming first resins on the emission stack; providing the first resins to fill first grooves of a first mold; and forming the first micro patterns on the emission stack by removing the first mold.

The forming of the insulating film may include forming second micro patterns on the emission stacked pattern and the insulating film pattern; and forming the insulating film by etching the insulating film pattern along the second micro patterns.

The forming of the second micro patterns may include forming second resins on the emission stacked pattern and the insulating film pattern that surrounds the outer surface of the emission stacked pattern; providing the second resins to fill second grooves of a second mold; and forming second micro patterns, by removing the second mold, on the emission stacked pattern and the insulating film pattern that surrounds the outer surface of the emission stacked pattern.

A shape of the first groove of the first mold may be different from a shape of the second groove of the second mold.

The forming of the insulating film may include forming the insulating film to have an outer surface that has a same shape as a shape of the outer surface of the emission stacked pattern.

The outer surface of the emission stacked pattern and the outer surface of insulating film may have a polygonal shape.

According to an embodiment, a display device may include a substrate including a display area and a non-display area; and pixels disposed in the display area of the substrate, each of the pixels including a plurality of sub-pixels. Each of the sub-pixels may include a pixel circuit layer including at least one transistor, and a display element layer including an emission area that emits light. The display element layer may include at least one light emitting element disposed on the substrate and emitting light, a first electrode and a second electrode spaced apart from each other, the light emitting element being disposed between the first electrode and the second electrode, a first contact electrode electrically connecting the first electrode and a first end of the light emitting element, and a second contact electrode electrically connecting the second electrode and a second end of the light emitting element. The light emitting element may include an emission stacked pattern including a first conductive semiconductor layer, an active layer disposed on the first conductive semiconductor layer, and a second conductive semiconductor layer disposed on the active layer. The light emitting element may also include an insulating film surrounding the outer surface of the emission stacked pattern and having a non-uniform thickness.

In the light emitting element included in the display device, a shape of the outer surface of the emission stacked pattern is different form a shape of an outer surface of the insulating film.

A light emitting element in the embodiments includes an emission stacked pattern, and an insulating film which surrounds the outer surface of the emission stacked pattern and has a non-uniform thickness, and may prevent adjacent light emitting elements from becoming agglomerated together.

Therefore, it is possible to prevent deterioration in light-emitting characteristics in a display device including the light emitting element of the embodiments.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1A:
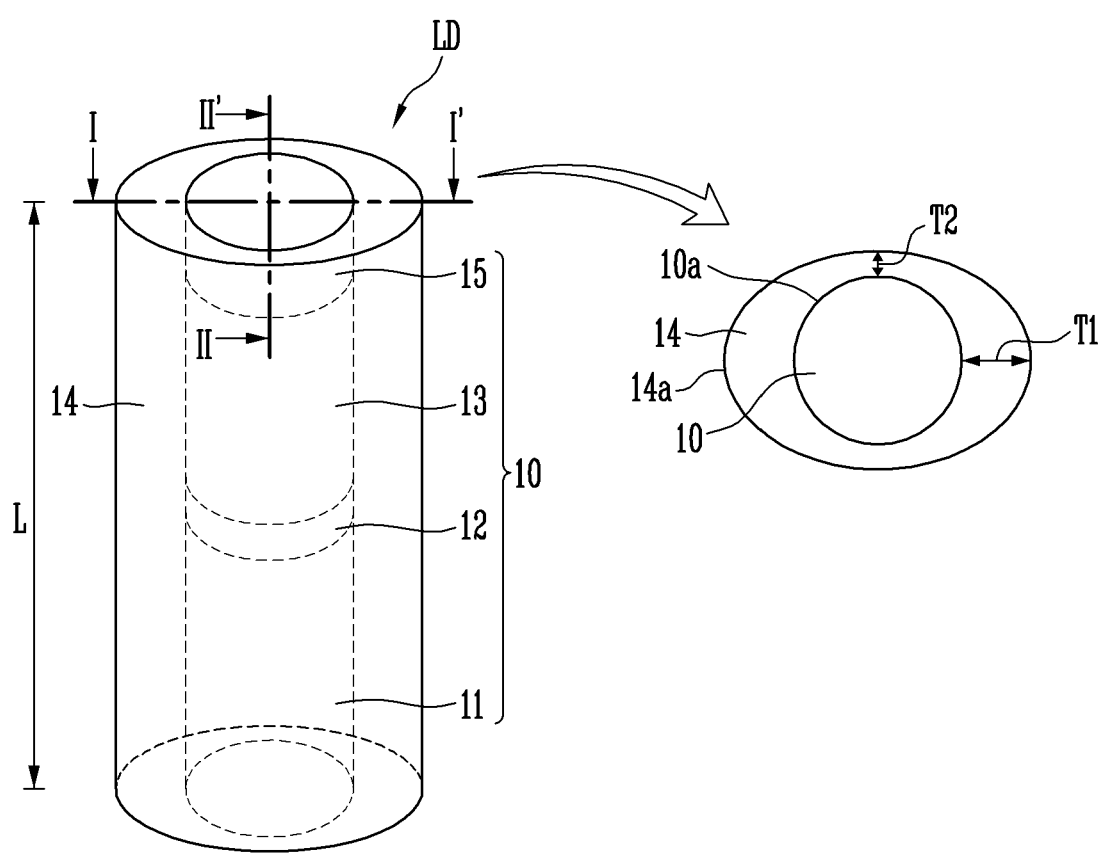
FIG. 1A is a schematic perspective view of a light emitting element according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Like components will be designated by like reference symbols. Furthermore, it should be noted that the drawings may be exaggerated in thickness, ratio, and dimension of components for descriptive convenience and clarity only. The term "and/or" includes any and all combinations of one or more of the associated listed items.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the specification and the claims, the singular forms are intended to include the plural forms as well, unless the context clearly indicates otherwise.

Also, the terms "under," "below," "above," "upper," and the like are used herein for explaining relationship between one or more components illustrated in the drawings. These terms may be relative terms describing the positions of components in the drawings, but the positions of components are not limited thereto.

It will be further understood that the terms "comprise," "include," "have," etc. when used in this specification, specify the presence of stated features, integers, steps, operations, elements, components, and/or combinations of them but do not preclude the presence or addition of one or more other features, integers, steps, operations, elements, components, and/or combinations thereof.

As used herein, the singular forms, "a," "an," and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween. It will be understood that the terms "connected to" or "coupled to" may include a physical or electrical connection or coupling.

Figure 1B:
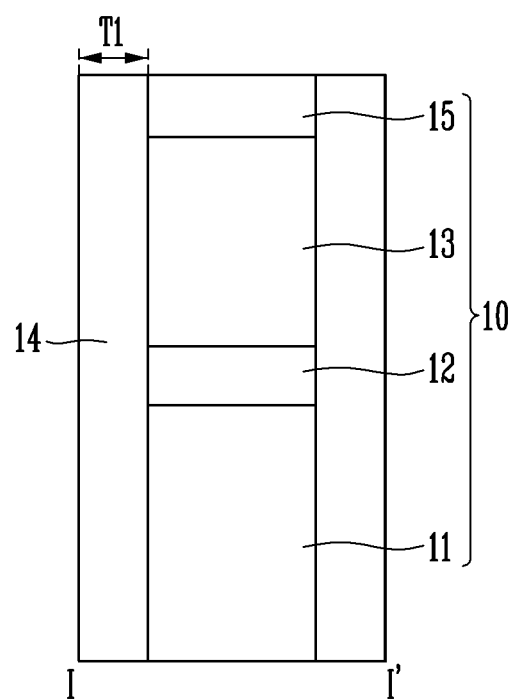
FIG. 1B is a schematic cross-sectional view taken along line I-I' of FIG. 1A.

FIG. 1A is a schematic perspective view of a light emitting element according to an embodiment when seen from above. FIG. 1B is a schematic cross-sectional view taken along line I-I' of FIG. 1A, and FIG. 1C is a schematic cross-sectional view taken along line II-II' of FIG. 1A.

Figure 1C:
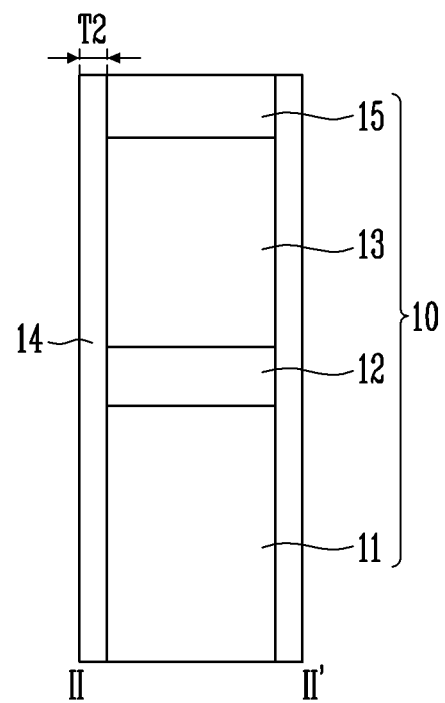
FIG. 1C is a schematic cross-sectional view taken along line II-II' of FIG. 1A.
Figure 2A:
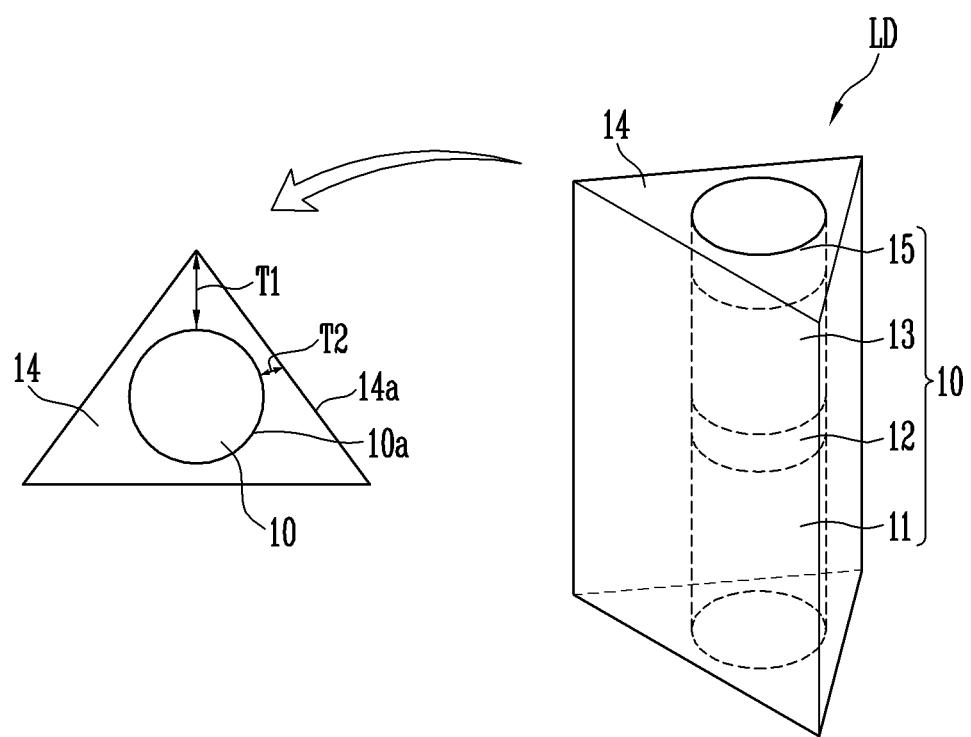
FIGS. 2A to 2D are schematic perspective views of a light emitting element according to an embodiment.
Figure 2B:
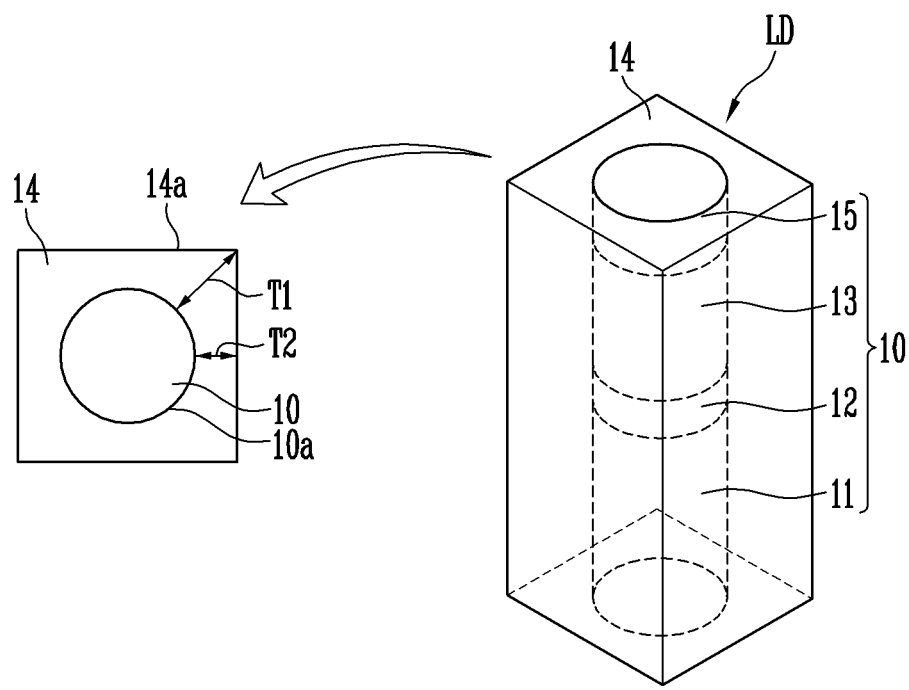
Figure 2C:
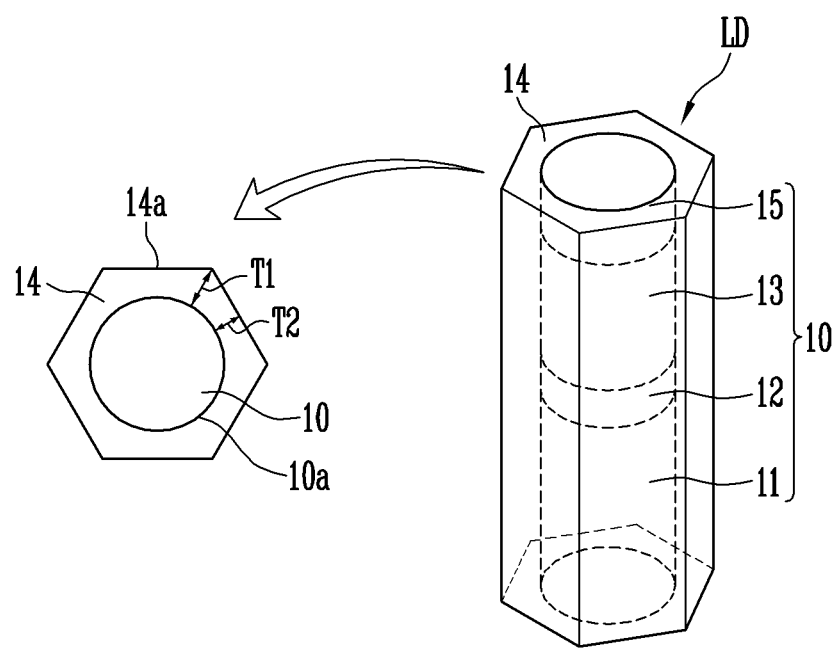
Figure 2D:
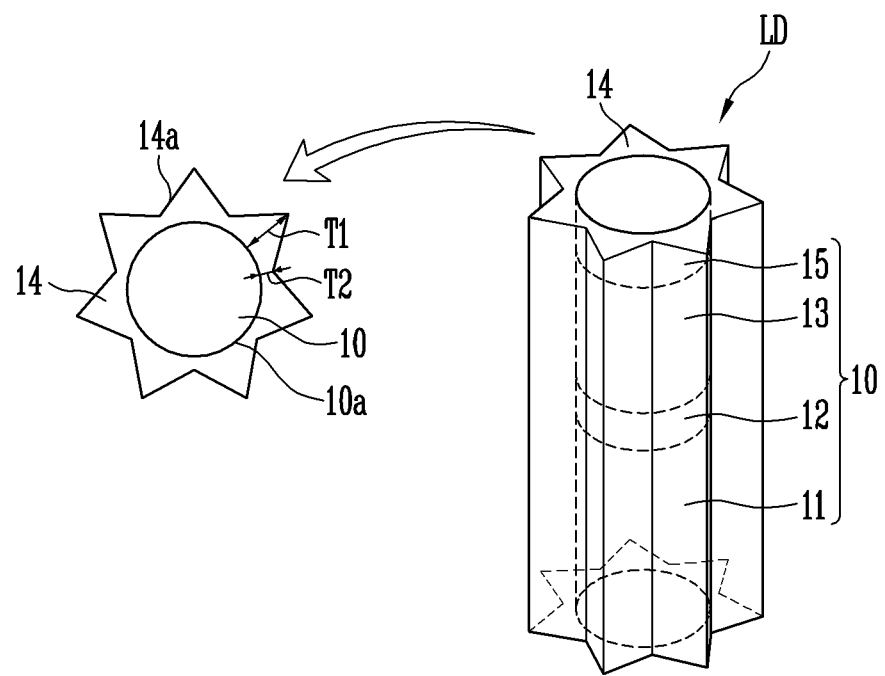

As shown in FIGS. 1A, 1B, and 1C, the light emitting element LD according to an embodiment includes an emission stacked pattern 10, and an insulating film 14 which covers an outer surface 10a of the emission stacked pattern 10. The emission stacked pattern 10 may be formed in a cylindrical shape, and the insulating film 14 is not uniform in thickness. The shape of the outer surface 10a of the emission stacked pattern 10 may be different from the shape of the outer surface 14a of the insulating film 14.

The emission stacked pattern 10 may include a first conductive semiconductor layer 11, an active layer 12, and a second conductive semiconductor layer 13. The emission stacked pattern 10 may include a stacked structure formed by sequentially stacking the first conductive semiconductor layer 11, the active layer 12, and the second conductive semiconductor layer 13 in a longitudinal direction L of the light emitting element LD. The light emitting element LD including the emission stacked pattern may be provided in the shape of a rod extending in one direction. The term "rod" shape includes a rod-like shape or a bar-like shape extending in the longitudinal direction L (i.e., having an aspect ratio greater than 1).

The emission stacked pattern 10 may have a rod shape formed by successively stacking the first conductive semiconductor layer 11, the active layer 12, and the second conductive semiconductor layer 13 in the longitudinal direction L of the light emitting element LD, and may have a first end and a second end with respect to the active layer 12. The first conductive semiconductor layer 11 may be disposed on the first end of the emission stacked pattern 10, and the second conductive layer 13 may be disposed on the second end of the emission stacked pattern 10, or vice versa.

The light emitting element LD may have a small size ranging from a nanometer scale to a micrometer scale, for example, the light emitting element LD may have a diameter and/or length ranging from the nanometer scale to the micrometer scale. However, the embodiments are not limited by the size of the light emitting element LD. For example, the size of the light emitting element LD may change depending on the design conditions of the devices, e.g., the display devices, which use a light emitting device including the light emitting element LD as a light source.

The first conductive semiconductor layer 11 may include at least one n-type semiconductor layer. For example, the first conductive semiconductor layer 11 may include an n-type semiconductor layer which includes any one semiconductor material of InAlGaN, GaN, AlGaN, InGaN, AlN, and InN, and which is doped with a first conductive dopant such as Si, Ge, or Sn. However, the materials forming the first conductive semiconductor layer 11 is not limited to these, and the first conductive semiconductor layer 11 may be formed of other materials.

The active layer 12 may be formed in a single or multi quantum well structure. Although not shown in the drawings, a cladding layer doped with the conductive dopant may be further formed on and/or under the active layer 12. For example, the cladding layer may be formed of an AlGaN layer or an InAlGaN layer. A material such as AlGaN or AlInGaN may be used to form the active layer 12, and various other materials may also be used to form the active layer 12.

The second conductive semiconductor layer 13 may include a semiconductor layer of a type different from that of the first conductive semiconductor layer 11. For example, the second conductive semiconductor layer 13 may include at least one p-type semiconductor layer. For instance, the second conductive semiconductor layer 13 may include a p-type semiconductor layer which includes at least one semiconductor material of InAlGaN, GaN, AlGaN, InGaN, AlN, and InN, and which is doped with a second conductive dopant such as Mg. However, the materials forming the second conductive semiconductor layer 13 is not limited to these, and the second conductive semiconductor layer 13 may be formed of various other materials.

An electrode layer 15 may be further disposed on the first end of the emission stacked pattern 10. In the drawings, the electrode 15 is disposed on the second conductive semiconductor layer 13. In the embodiments, a stacked structure including the first conductive semiconductor layer 11, the active layer 12, the second conductive layer 13, and the electrode layer 15 is referred to as the emission stacked pattern 10.

The electrode layer 15 may be an ohmic contact electrode electrically connected to the second conductive semiconductor layer 13, but the embodiments are not limited thereto. The electrode layer 15 may be made of a transparent or opaque material. The electrode layer 15 may use metal materials such as Cr, Ti, Al, Au, or Ni, or transparent conductive oxides such as ITO, IZO, or ITZO, either alone or in a combination thereof.

If a predetermined voltage is applied to both ends of the emission stacked pattern 10, the emission stacked pattern 10 may emit light while electrons are combined with holes in the active layer 12. Using this principle, the emission stacked pattern 10 may be used as a light source of the display device.

Since the emission stacked pattern 10 has a cylindrical shape, the outer surface 10a of the emission stacked pattern 10 may be circular. The first conductive semiconductor layer 11, the active layer 12, the second conductive semiconductor layer 13, and the electrode layer 15 each may have a cylindrical shape. Furthermore, although not shown in the drawings, the emission stacked pattern 10 may have the shape of an elliptical column or the shape of a polygonal column. In this case, the first conductive semiconductor layer 11, the active layer 12, the second conductive semiconductor layer 13, and the electrode layer 15 each may have the shape of an elliptical column or the shape of a polygonal column.

The emission stacked pattern 10 may be covered by the insulating film 14. The insulating film 14 may surround the outer surface 10a of the emission stacked pattern 10m and may prevent the active layer 12 from making contact with a conductive material except through the first conductive semiconductor layer and the second conductive semiconductor layer 13, and simultaneously minimizes the surface defects of the emission stacked pattern 10. The insulating film 14 may include various materials having insulating properties, for example, one or more insulating materials selected from a group consisting of $SiO_2$, $Al_2O_3$, and $TiO_2$. However, the embodiments are not limited thereto.

In the drawings, the insulating film 14 completely covers the outer surface 10a of the emission stacked pattern 10. However, the insulating film 14 may cover only a portion of the emission stacked pattern 10. The insulating film 14 may completely cover the active layer 12, and may expose portions of the first conductive semiconductor layer 11, the second conductive semiconductor layer 13, and the electrode layer 15.

The light emitting element LD including the emission stacked pattern 10 and the insulating film 14 may be a subminiature light emitting element LD having a very small size corresponding to a nanometer scale. In order to use the light emitting element LD as the light source of the display device, the light emitting elements LD may be arranged in pixels of the display device. For example, a solution in which the light emitting elements LD are dispersed may be applied to each pixel area to use the light emitting elements LD as the light source of the display device.

Because the light emitting elements LD are very small, they may be disposed close to each other or become agglomerated within the pixel. Adjacent light emitting elements LD may come into contact with each other, such that insulating films 14 of such light emitting elements LD may come into contact with each other. A portion of the insulating film 14 may be removed where the light emitting elements LD come into contact with each other, and cause a short-circuit.

The light emitting elements LD according to the embodiment include insulating layers 14 having the outer surface 14a that is different in shape from the outer surface 10a of the emission stacked pattern 10, such that the thickness of the insulating film 14 may not be uniform.

As illustrated in FIG. 1A, the cross-section of the cylindrical emission stacked pattern 10, i.e., the outer surface 10a of the emission stacked pattern 10 may be circular, but the outer surface 14a of the insulating film 14 may be elliptical. The insulating film 14 may not be uniform in thickness, and may include a first thickness T1 that is relatively thicker than a second thickness T2 that is relatively thin.

In the light emitting element LD of the embodiments, the thickness of the insulating film 14 is non-uniform. Thus, even if the light emitting elements LD are agglomerated or disposed adjacent to each other, the emission stacked patterns 10 of the light emitting elements LD may be separated by a sufficient distance because of the insulating film 14 having the non-uniform thickness. The non-uniform thickness of the insulating film 14 may also prevent adjacent light emitting elements LD from being agglomerated. Furthermore, even if a portion of the insulating film 14 is removed from a portion where the light emitting elements LD are adjacent to each other, the thickness of the insulating film 14 varies and may prevent the emission stacked pattern 10 from being exposed to the outside.

Hereinafter, light emitting elements according to an embodiment will be described with reference to the accompanying drawings.

FIGS. 2A to 2D are schematic perspective views of a light emitting element according to an embodiment.

As illustrated in FIGS. 2A, 2B, 2C, and 2D, the light emitting element LD according to an embodiment may have a polygonal shape in which the outer surface 14a of the insulating film 14 may have a polygonal shape with three or more sides and surrounding the outer surface 10a of the emission stacked pattern 10 having a cylindrical shape. The insulating film 14 may not be uniform in thickness, and may include a first thickness T1 that is relatively thicker than a second thickness T2.

Figure 3A:
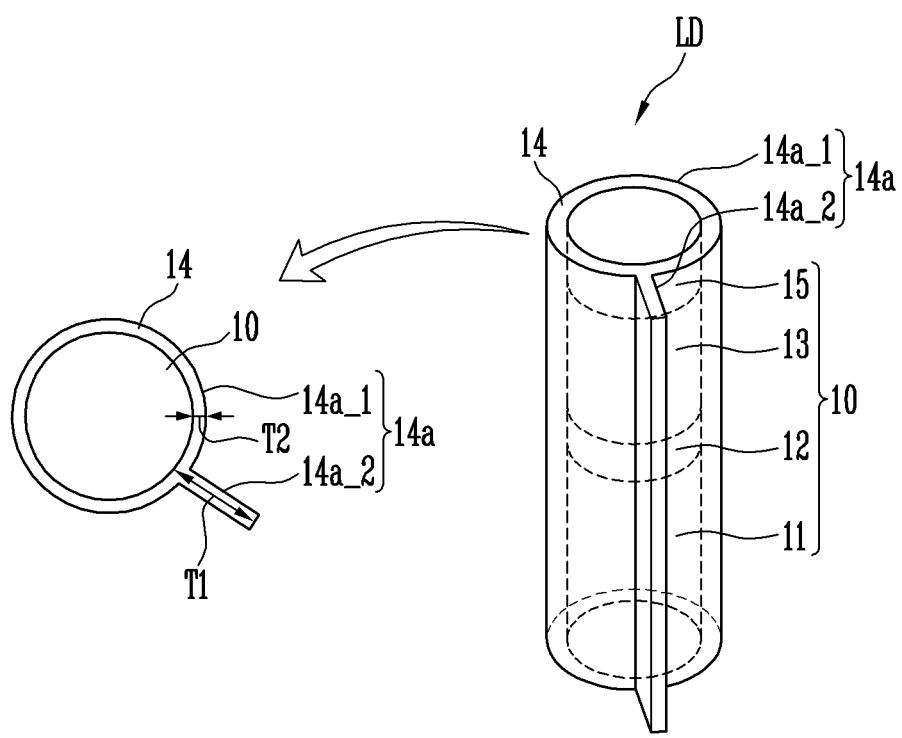
FIGS. 3A to 3C are schematic perspective views of a light emitting element according to a further embodiment.
Figure 3B:
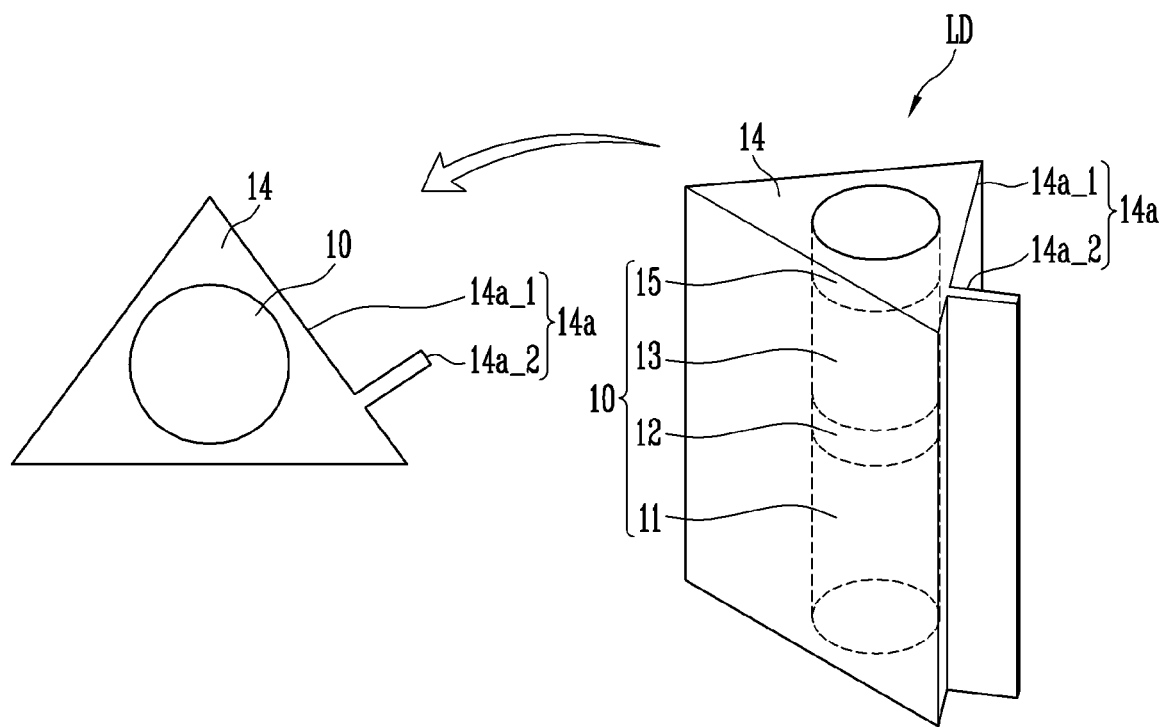
Figure 3C:
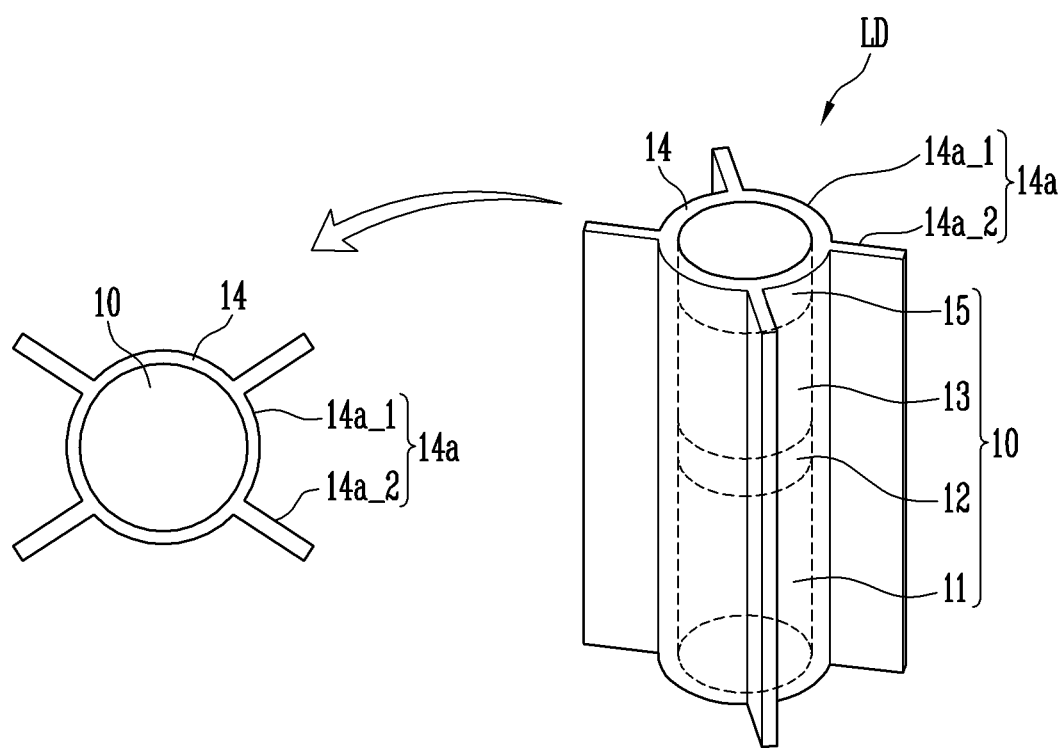

FIGS. 3A to 3C are schematic perspective views of a light emitting element LD according to an embodiment.

In the light emitting element according to an embodiment, the insulating film 14 may include at least one protrusion 14a_2 on the outer surface 14a. Therefore, even if the light emitting elements LD (FIG. 1A) are disposed adjacent to each other, the protrusion 14a_2 may insure there is sufficient distance between the emission stacked patterns 10 Even if the protrusion 14a_2 may be damaged in a portion where the light emitting elements LD are adjacent to each other, it is possible to efficiently prevent the emission stacked pattern 10 from being exposed to the outside.

As illustrated in FIG. 3A, the outer surface 14a of the insulating film 14 may have the protrusion 14a_2, and the remaining area 14a_1 of the outer surface 14a of the insulating film 14 except for the protrusion 14a_2 may have the same shape as the outer surface 10a of the emission stacked pattern 10. The thickness of the insulating film 14 is the thickest at the protrusion 14a_2. When the outer surface 14a of the insulating film 14 has the protrusion 14a_2, the difference between the relatively thick first thickness T1 and the relatively thin second thickness T2 of the insulating film 14 is large, and this difference may efficiently prevent adjacent light emitting elements LD from being agglomerated. As illustrated in FIG. 3B, the shape of the remaining area 14a_1 of the outer surface 14a of the insulating film 14 except for the protrusion 14a_2 may also be different from the outer surface 10a of the emission stacked pattern 10.

The protrusion 14a_2 may serve to separate the emission stack patterns 10 of the light emitting elements LD at a sufficient distance. When the outer surface 14a of the insulating film 14 includes at least two protrusions 14a_2, a separation distance may be stably maintained between the light emitting elements LD. For example, as illustrated in FIG. 3C, when the outer surface 14a of the insulating film 14 has four protrusions 14a_2, it is possible to stably maintain a separation distance between the light emitting elements LD. The width and length of the protrusion 14a_2 may be easily changed.

Hereinafter, a method of manufacturing a light emitting element according to the embodiments will be described in detail with reference to the accompanying drawings.

Figure 4A:
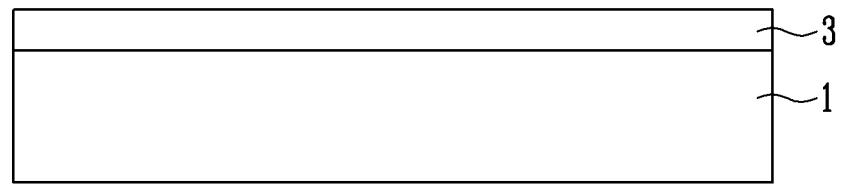
FIGS. 4A to 4O are schematic cross-sectional views illustrating a method of manufacturing the light emitting element of FIG. 1A.

FIGS. 4A to 4O are schematic cross-sectional views illustrating the method of manufacturing the light emitting element LD of FIG. 1A.

As illustrated in FIG. 4A, a substrate 1 is prepared, and a sacrificial layer 3 is formed on the substrate 1. The substrate 1 may be a GaAs, GaP, or InP substrate. The substrate may be a wafer for epitaxial growth. For example, the substrate 1 may include a ZnO substrate having a GaAs layer on a surface. Furthermore, a Ge substrate having the GaAs layer on the surface and an Si substrate having the GaAs layer on an Si wafer with a buffer layer being interposed therebetween may also be applied.

A commercially available mono-crystal substrate may be used as the substrate 1. Any material that satisfies the selection ratio for manufacturing the light emitting element LD (refer to FIG. 1A) and performs epitaxial growth smoothly is suitable as the material for substrate 1. In the embodiment, the substrate 1 is described as a GaAs substrate.

The surface of the substrate 1 to be epitaxially grown may be flat. The size and diameter of the substrate 1 may vary depending on the product to which the substrate 1 is applied, and may be manufactured in a form capable of reducing bending caused by a stacked structure due to epitaxial growth. The shape of the substrate 1 is not limited to a circular shape, and may have a polygonal shape such as a rectangle.

The sacrificial layer 3 may be formed on the substrate 1 by an MOCVD method, an MBE method, a VPE method, an LPE method, or the like. The sacrificial layer 3 may be formed of GaAs, AlAs or AlGaAs. In the following embodiment, the sacrificial layer 3 is described as being made of GaAs.

The substrate 1 and the sacrificial layer 3 may be disposed to come into contact with each other. The sacrificial layer 3 may be positioned between the light emitting element LD and the substrate 1 in the process of manufacturing the light emitting element LD (FIG. 1A) to physically separate the light emitting element LD (FIG. 1A) from the substrate 1.

The sacrificial layer 3 may have various structures, i.e., a single layer structure or a multilayer structure. The sacrificial layer 3 may be a layer which is removed in a final manufacturing process of forming the light emitting element LD (refer to FIG. 1A). When the sacrificial layer 3 is removed, interlayer separation may be performed above and under the sacrificial layer 3.

Figure 4B:
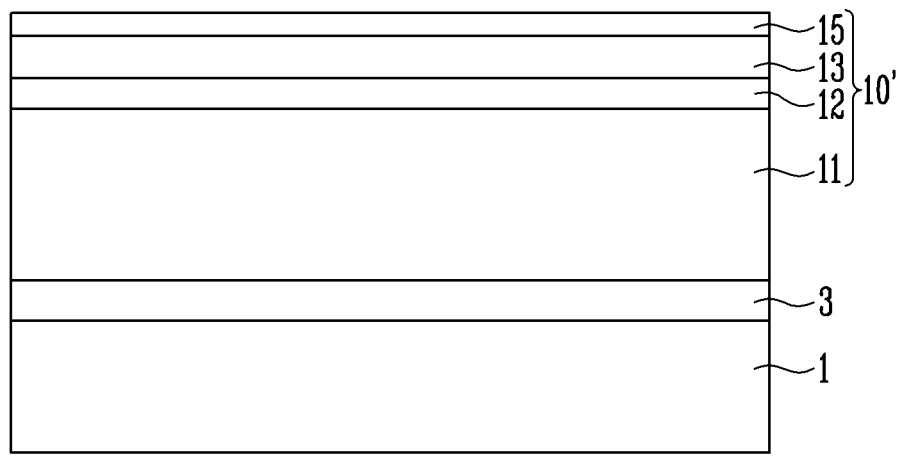

Referring to FIG. 4B, in the embodiments, an emission stack structure 10' may be formed on the sacrificial layer 3. The emission stack structure 10' may be formed by a step of forming the first conductive semiconductor layer 11 on the sacrificial layer 3, a step of forming the active layer 12 on the first conductive semiconductor layer 11, a step of forming the second conductive semiconductor layer 13 on the active layer 12, and a step of forming the electrode layer 15 on the second conductive semiconductor layer 13 in a sequence.

As with the sacrificial layer 3, the first conductive semiconductor layer 11 may be formed by epitaxial growth, and be formed by the MOCVD method, the MBE method, the VPE method, the LPE method or the like. In an embodiment, an additional semiconductor layer for improving crystallinity, such as a buffer layer and an undoped semiconductor layer, may be further formed between the first conductive semiconductor layer 11 and the sacrificial layer 3.

The first conductive semiconductor layer 11 may include a semiconductor material composed of group III (Ga, Al, In)-group V (P, As) elements, and may include a semiconductor layer doped with a first conductive dopant such as Si, Ge, or Sn. For example, the first conductive semiconductor layer 11 may include at least one semiconductor material among GaP, GaAs, GaInP, and AlGaInP doped with Si. The first conductive semiconductor layer 11 may include at least one n-type semiconductor layer. The materials forming the first conductive semiconductor layer 11 are not limited to these, and the first conductive semiconductor layer 11 may be formed of other materials.

The active layer 12 is an area in which electrons and holes are recombined. As the electrons and the holes are recombined, the active layer may transition to a low energy state and emit light having a wavelength corresponding thereto.

The active layer 12 may be formed on the first conductive semiconductor layer 11 and have a single or multiple quantum well structure. The location of the active layer 12 may be changed depending on the type of the light emitting element LD.

The active layer 12 may include at least one of GaInP, AlGaInP, GaAs, AlGaAs, InGaAs, InGaAsP, InP, and InAs. The active layer 12 may emit light having a wavelength of about 400 nm to about 900 nm. The active layer 12 may use a double heterostructure. In an embodiment, a cladding layer (not shown) doped with the conductive dopant may be further formed on an upper surface and/or a lower surface of the active layer 12.

The second conductive semiconductor layer 13 may include a semiconductor layer of a type different from that of the first conductive semiconductor layer 11. The second conductive semiconductor layer 13 may include semiconductor material composed of group III (Ga, Al, In)-group V (P, As) elements, and may include a semiconductor layer doped with a second conductive dopant such as Mg. For example, the second conductive semiconductor layer 13 may include at least one semiconductor material among GaP, GaAs, GaInP, and AlGaInP doped with Mg. The second conductive semiconductor layer 13 may include a p-type semiconductor layer. However, the materials forming the second conductive semiconductor layer 13 are not limited thereto.

The electrode layer 15 is formed on the second conductive semiconductor layer 13. The electrode layer 15 may include metal or metal oxide. For example, the electrode layer 15 may use Cr, Ti, Al, Au, Ni, ITO, IZO, ITZO, oxide or alloys either alone or in a combination thereof. In an embodiment, the electrode layer 15 may be made of a transparent metal oxide such as indium tin oxide (ITO) to minimize the loss of light generated from the active layer 12 and emitted to the outside of the light emitting element LD (refer to FIG. 1A), and to improve current spreading effects to the second conductive semiconductor layer 13. However, the embodiments are not limited thereto.

The first conductive semiconductor layer 11, the active layer 12, the second conductive semiconductor layer 13, and the electrode layer 15 which are sequentially stacked on the substrate 1 may form the emission stack structure 10'. However, the electrode layer 15 may be omitted and the first conductive semiconductor layer 11, the active layer 12, and the second conductive semiconductor layer 13 may form the emission stack structure 10'.

Figure 4C:
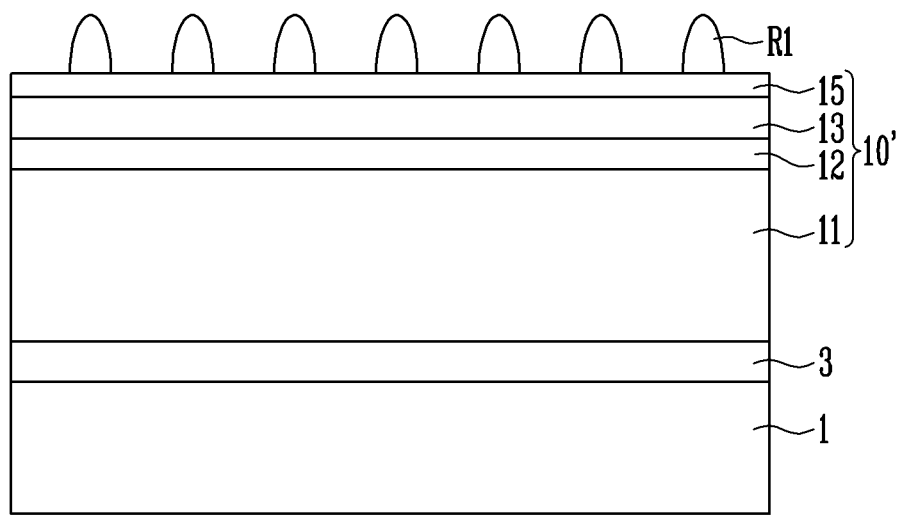
Figure 4D:
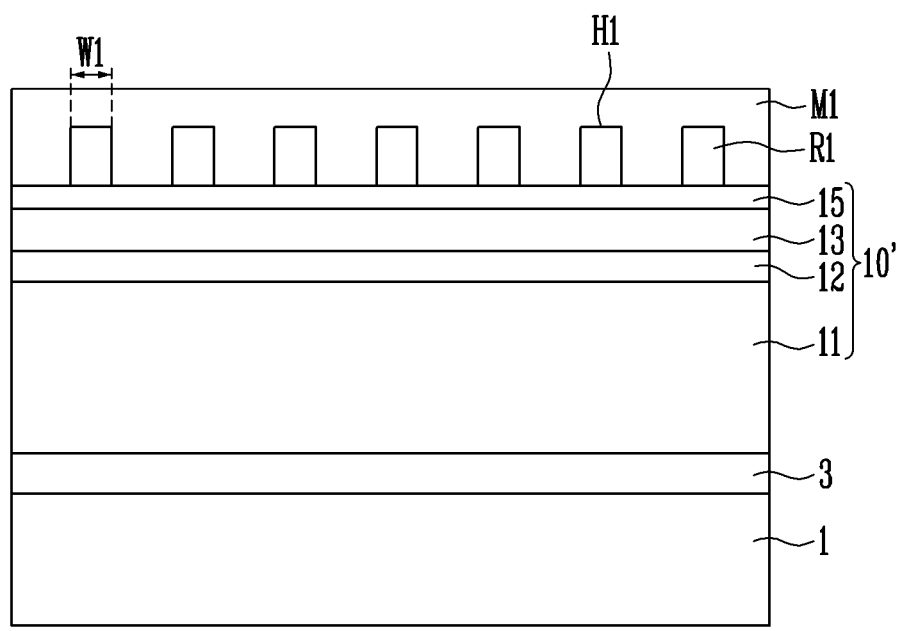

As illustrated in FIG. 4C, first resins R1 may be formed on the emission stack structure 10'. The first resins R1 may be applied to the emission stack structure 10' in the form of dots. The first resins R1 may include a photo-curing material. As illustrated in FIG. 4D, a first mold M1 including first grooves H1 is applied to the upper surface of the emission stack structure 10'. Here, the first mold M1 is a soft mold, and the first grooves H1 of the first mold M1 may be in close contact with the emission stack structure 10' using a roll laminating process. When the first mold M1 includes a transparent material and then a process such as UV curing is performed to cure the first resins R1. UV light may pass through the transparent first mold M1 to cure the first resins R1.

Hereinafter, the first mold will be described in detail with reference to the accompanying drawings.

Figure 5A:
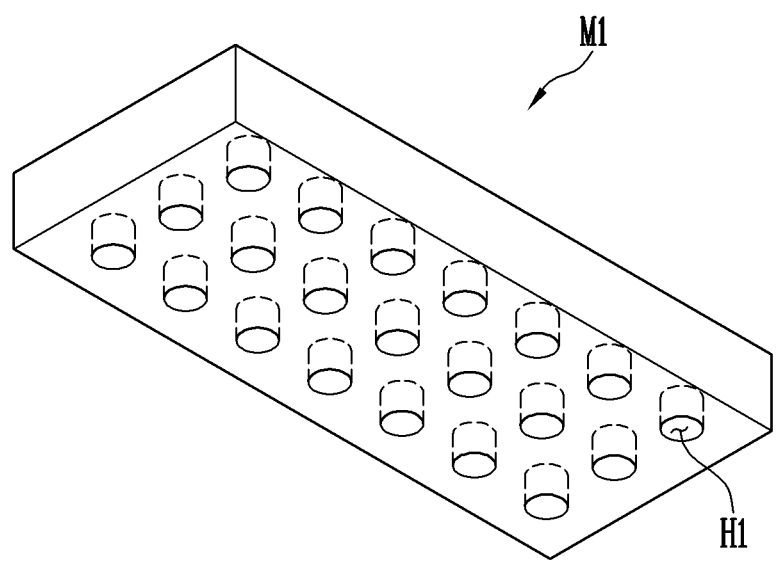
FIG. 5A is a schematic perspective view of a first mold shown in FIG. 4D.
Figure 5B:
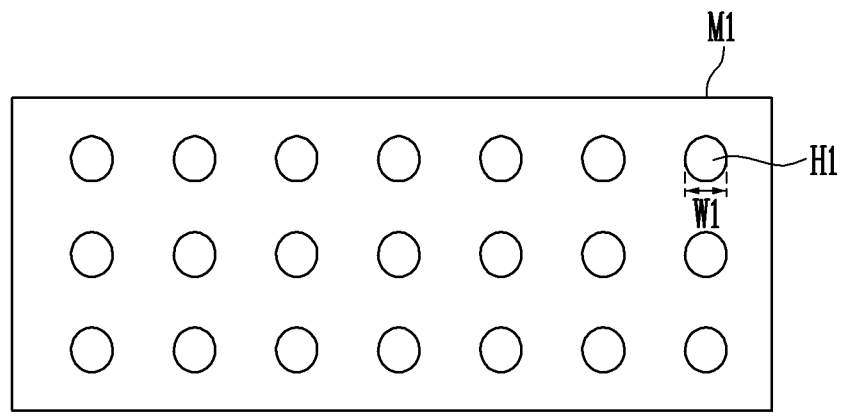
FIG. 5B is a schematic plan view of the first mold of FIG. 5A when seen from below.

FIG. 5A is a schematic perspective view of a first mold M1 shown in FIG. 4D, and FIG. 5B is a schematic plan view of the first mold M1 of FIG. 5A when seen from below.

As illustrated in FIGS. 5A and 5B, the first mold M1 includes first grooves H1 formed on a surface thereof. The first grooves H1 are filled with the first resins R1 (refer to FIG. 4C) formed on the emission stack structure 10' (refer to FIG. 4D), and the first resins R1 (refer to FIG. 4C) are formed in the shape of the first grooves H1.

In an embodiment, the first resins R1 (refer to FIG. 4C) formed in the shape of the first groove H1 is used as a mask for patterning the emission stack structure 10' (FIG. 4D). In order to form the emission stacked pattern 10, illustrated in FIG. 1A, into a cylindrical shape, each of the first grooves H1 may be circular. The emission stacked pattern 10 may be formed in a size ranging from the nanometer scale to the micrometer scale by adjusting a width W1 of the first groove H1. Although not illustrated in the drawings, the first groove H1 may also have a polygonal shape in order to form the emission stacked pattern 10 (FIG. 1A) into a polygonal column.

Referring to FIG. 4D, when the first mold M1 comes into contact with the upper surface of the emission stack structure 10', the first resins R1 may fill the first grooves H1. Furthermore, the first resins R1 may be cured using the UV or the like with the first resins R1 are filled in the first grooves H1. If the first resins R1 contain a hot curing material, the first resin R1 may be cured through heat.

Figure 4E:
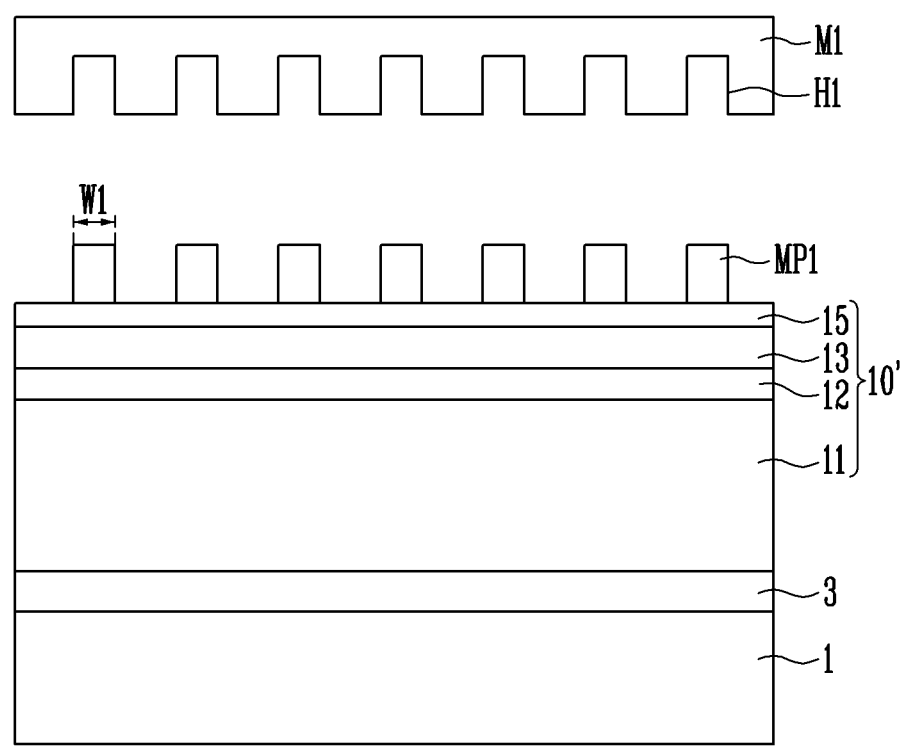
Figure 4F:
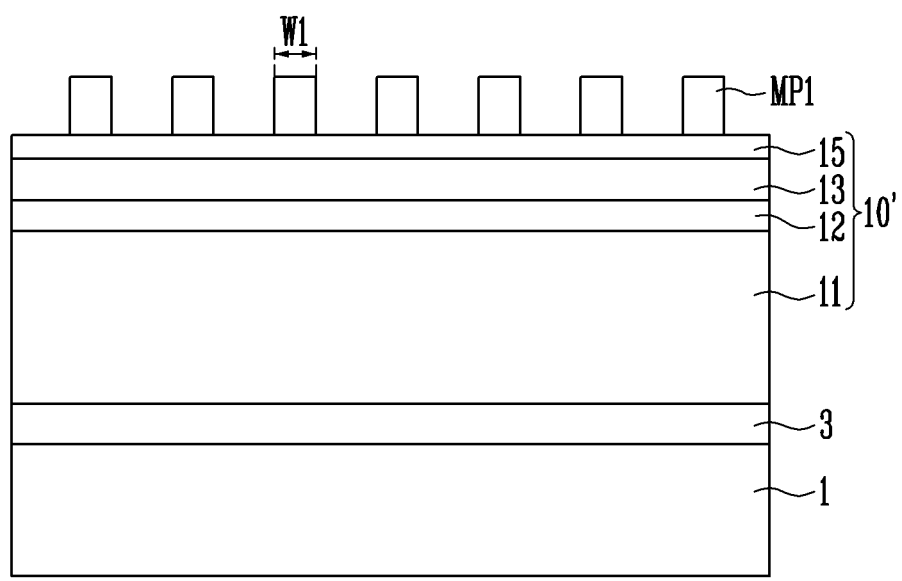

The first mold M1 may be separated and removed from the emission stack structure 10' as illustrated in FIG. 4E, to form the micro patterns MP1 on the emission stack structure 10' as illustrated in FIG. 4F. The edge of each first micro pattern MP1 is circular along the shape of the first grooves H1, and each first micro pattern MP1 also has the same width W1 as the first groove H1.

Figure 4G:
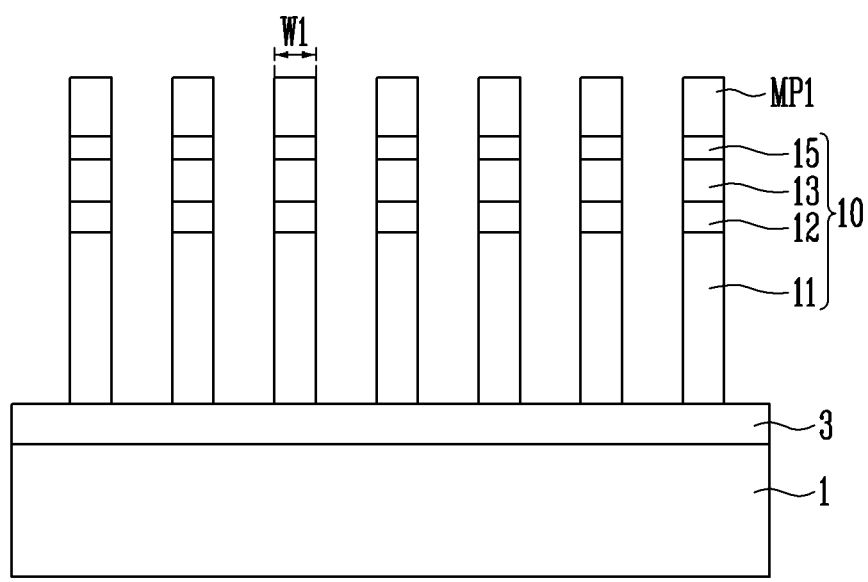

Subsequently, as illustrated in FIG. 4G, the emission stack structure 10' (FIG. 4F) may be etched in a vertical direction using the first micro patterns MP1 as the mask to form the emission stacked patterns 10.

The electrode layer 15, the second conductive semiconductor layer 13, the active layer 12, and the first conductive semiconductor layer 11 in an area exposed by the first micro pattern MP1 may be etched to form the emission stacked patterns 10.

The primary etching may use a dry etching method such as RIE (reactive ion etching), RIBE (reactive ion beam etching), or ICP-RIE (inductively coupled plasma reactive ion etching). Unlike a wet etching method, the dry etching methods allow anisotropic etching suitable for forming the emission stacked patterns 10. However, the embodiments are not limited by the etching methods used.

Figure 4H:
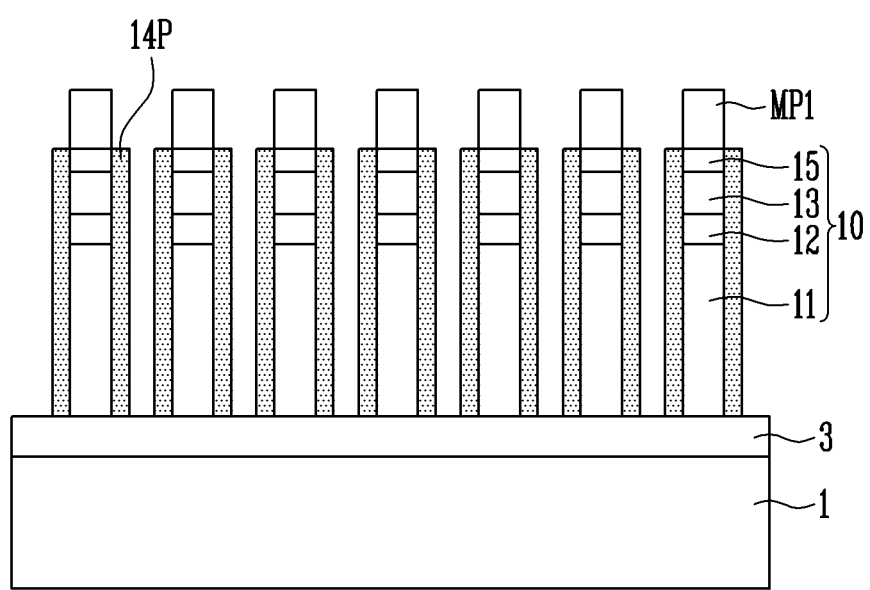

Subsequently, as illustrated in FIG. 4H, insulating film patterns 14P surrounding the outer surface of the emission stacked patterns 10 including the first micro patterns MP1 may be formed. In the drawing, the insulating film patterns 14P completely surround the outer surface of the emission stacked patterns 10. However, as described above, the insulating film pattern 14P may be formed to expose a portion of the emission stacked pattern 10. Here, the outer surface of the insulating film pattern 14P may also be circular to surround the circular outer surface of the cylindrical emission stacked pattern 10. The shape of the outer surface of the emission stacked pattern 10 is the same as that of the outer surface of the insulating film pattern 14P.

The insulating film patterns 14P may include various materials having insulating properties. For example, the insulating film patterns 14P may include one or more insulating materials selected from a group consisting of $SiO_2$, $Si_3N_4$, $Al_2O_3$, and $TiO_2$. However, the embodiments are not limited thereto.

Figure 4I:
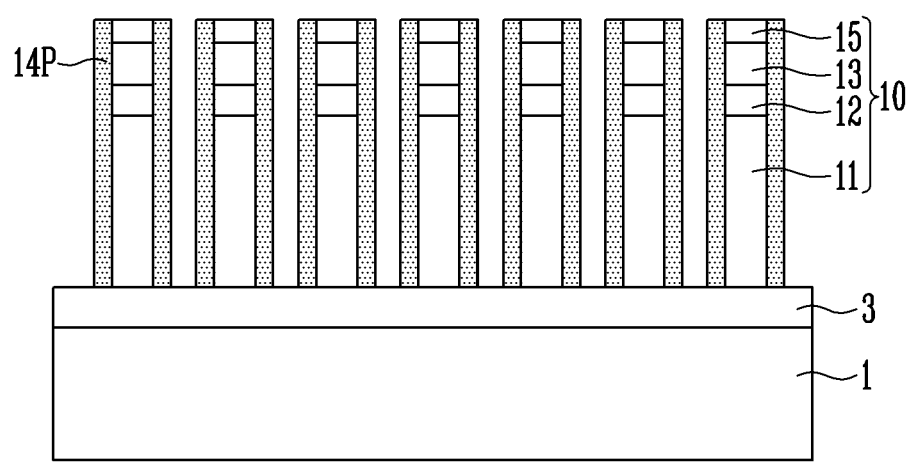

As illustrated in FIG. 4I, the electrode layer 15 of each emission stacked pattern 10 may be exposed by removing the first micro pattern MP1 that remains on the upper surface of each emission stacked pattern 10.

Figure 4J:
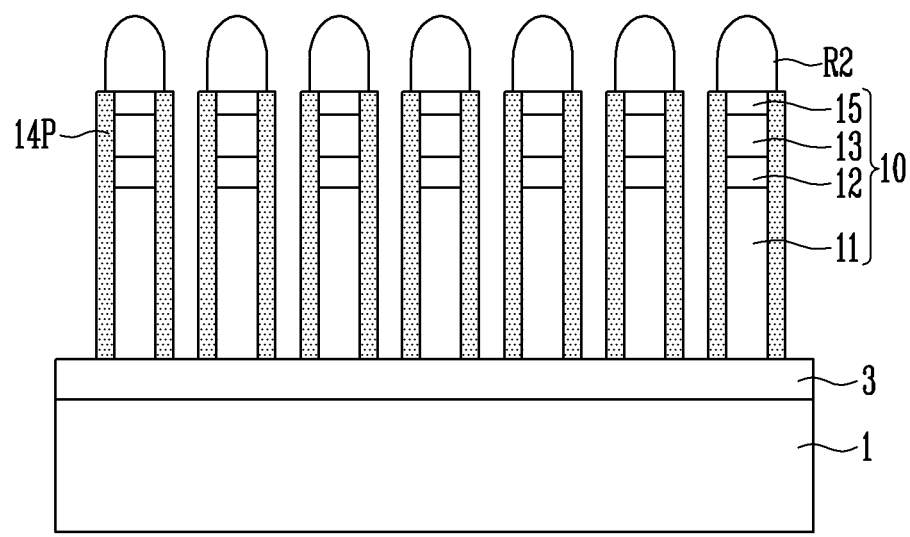
Figure 4K:
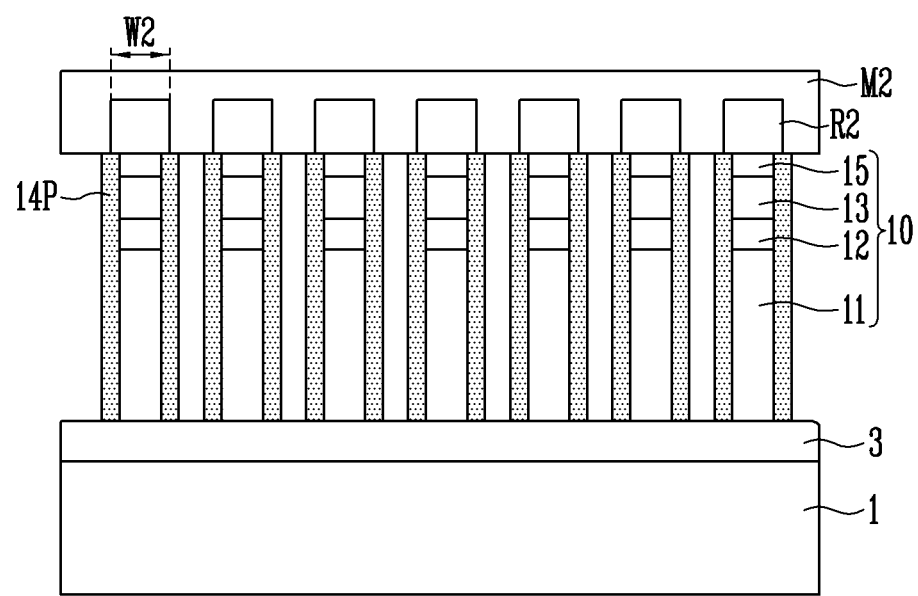

Subsequently, as illustrated in FIG. 4J, second resins R2 may be formed the emission stacked patterns 10. The second resins R2 may be applied to each emission stacked pattern 10 in the form of a dot. The second resin R2 may also include a photo-curing material as in the first resin R1 (refer to FIG. 4K). Subsequently, as illustrated in FIG. 4K, the second mold M2 including second grooves H2 may be applied to the upper surfaces of the emission stacked patterns 10. The second mold M2 may be a soft mold, and the second grooves H2 of the second mold M2 may be in close contact with the emission stacked pattern 10 using a roll laminating process. When the second mold M2 includes a transparent material, a process such as UV curing may be performed to cure the second resin R2. UV light may pass through the transparent second mold M2 to cure the second resin R2.

Hereinafter, the second mold will be described in detail with reference to the accompanying drawings.

Figure 6A:
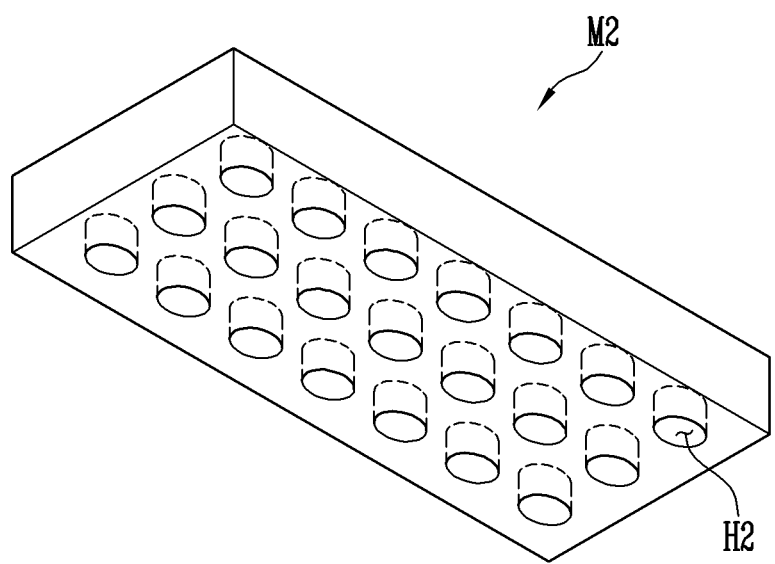
FIG. 6A is a schematic perspective view of a second mold shown in FIG. 4K.
Figure 6B:
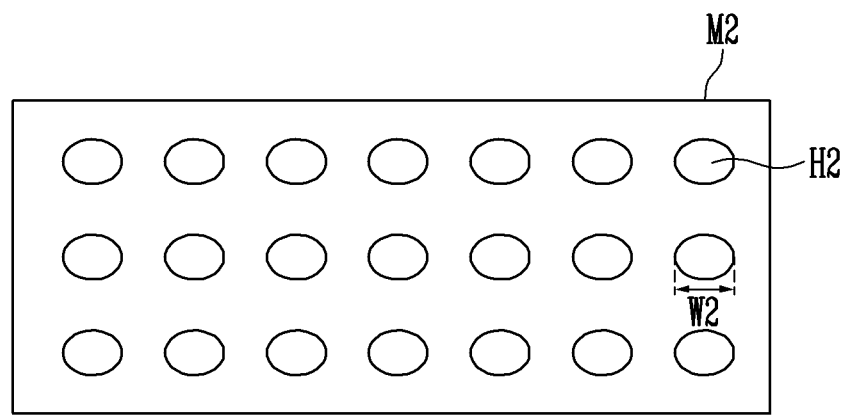
FIG. 6B is a schematic plan view of the second mold of FIG. 6A when seen from below.
Figure 7A:
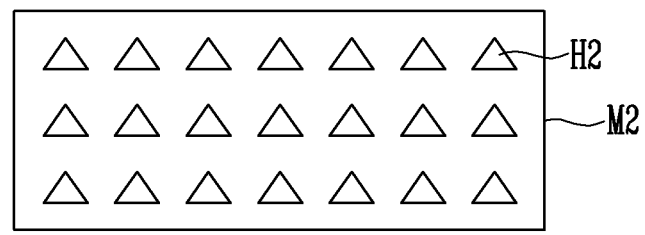
FIGS. 7A to 7G are diagrams illustrating various shapes of a second groove shown in FIG. 6B.
Figure 7B:
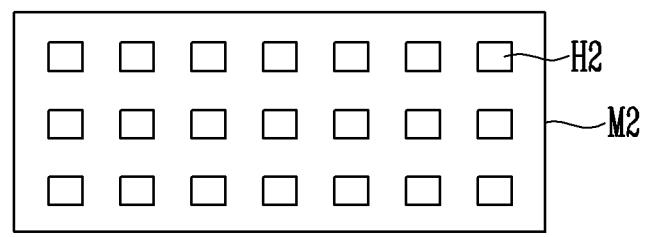
Figure 7C:
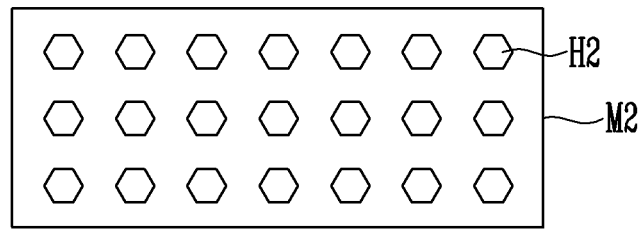
Figure 7D:
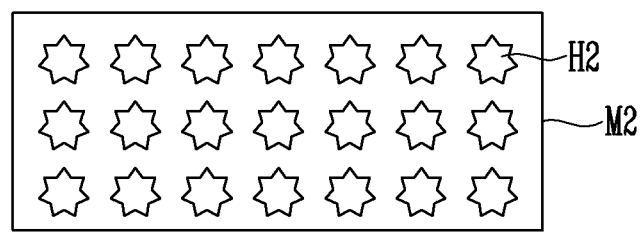
Figure 7E:
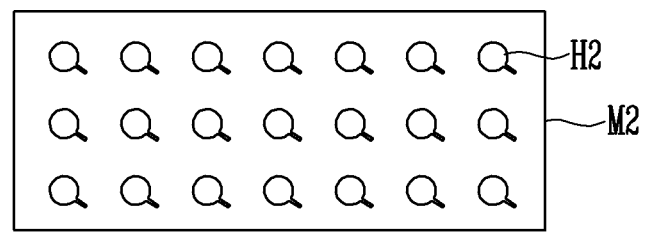
Figure 7F:
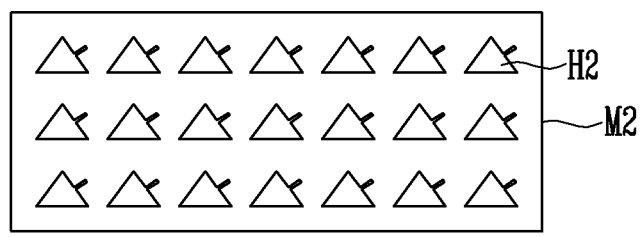
Figure 7G:
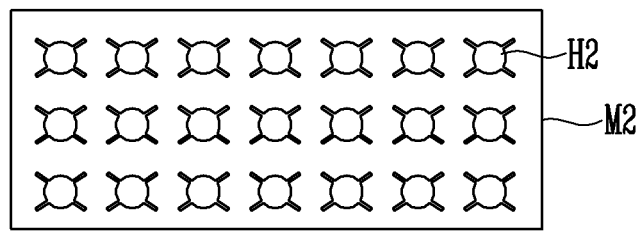

FIG. 6A is a schematic perspective view of the second mold M2 shown in FIG. 4K, and FIG. 6B is a schematic plan view of the second mold M2 of FIG. 6A when seen from below. Furthermore, FIGS. 7A to 7G are diagrams illustrating shapes the second grooves H2 shown in FIG. 6B may have.

As illustrated in FIGS. 6A and 6B, the second mold M2 includes second grooves H2 formed on a surface thereof. Here, the second groove H2 is used to remove a portion of the insulating film pattern 14P (refer to FIG. 4K) that surrounds the outer surface of the emission stacked pattern 10. Therefore, the width W2 of the second grooves H2 is greater than the width W1 of the first grooves H1 of the first mold M1 of FIGS. 5A and 5B.

Furthermore, as illustrated in FIG. 1A, the second groove H2 may have an elliptical shape to form the outer surface 14a of the insulating film 14 (refer to FIG. 1A) in an elliptical shape. The second groove H2 may have shapes illustrated in FIGS. 7A to 7G to form the shape of the outer surface 14a of the insulating film 14 into the shapes illustrated in FIGS. 2A to 2D, and 3A to 3C. Therefore, if the second groove H2 has an elliptical shape, a polygonal shape, a shape in which the elliptical shape and the polygonal shape are mixed, or a shape having a protrusion as illustrated in FIGS. 7A to 7G, the second micro pattern MP2 having the same shape as the second groove H2 may be formed.

Referring to FIG. 4K, when the second mold M2 is pressed against the upper surface of the emission stacked patterns 10, the second resins R2 may fill the second grooves H2 of the second mold M2. Furthermore, the second resins R2 are cured using UV light or the like with the second resins R2 filled in the second grooves H2.

Figure 4L:
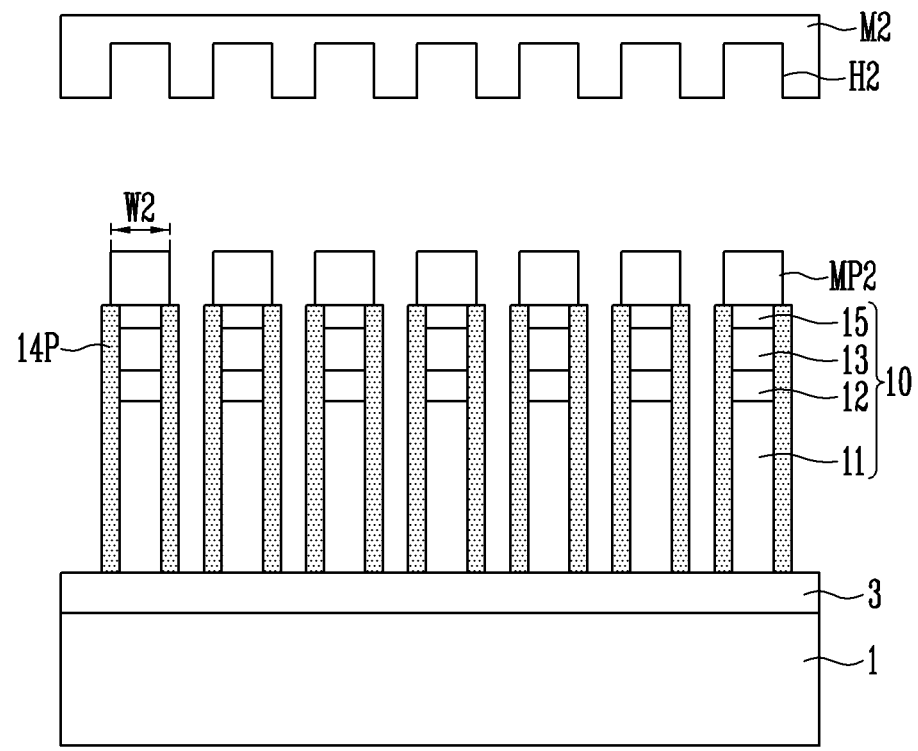

As illustrated in FIG. 4L, the second mold M2 may be separated and removed from the emission stacked patterns 10 to form the second micro patterns MP2 on the emission stacked patterns 10. Here, each of the second micro patterns MP2 may have a width W2 that is greater than the width W1 of the first micro pattern MP1 of FIG. 4F, such that the second micro pattern MP2 may also be disposed on the insulating film pattern 14P surrounding the outer surface of the emission stacked pattern 10.

Figure 4M:
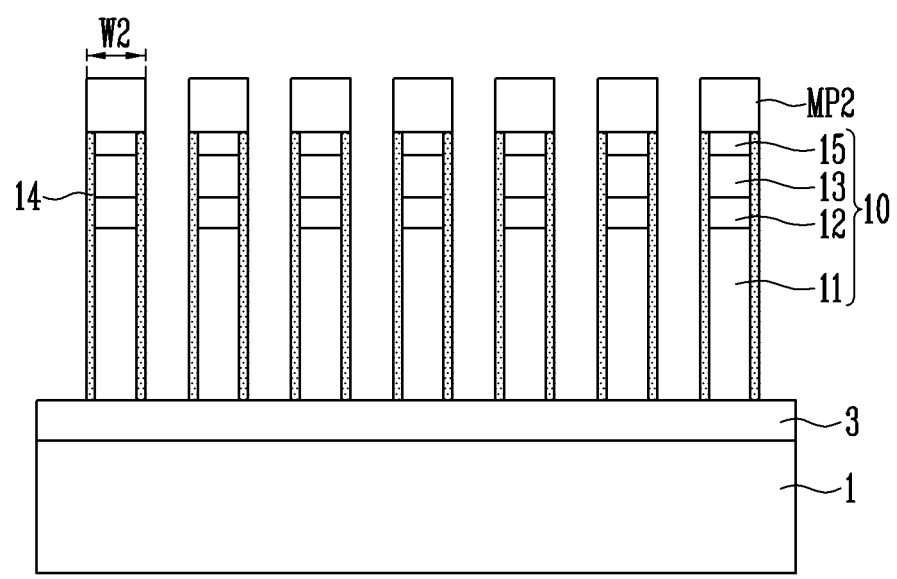

As illustrated in FIG. 4M, the insulating film pattern 14P surrounding the outer surface of each emission stacked pattern 10 may be vertically etched using the second micro pattern MP2 as the mask to form the insulating film 14. Therefore, the insulating film 14 may have a structure in which at least a portion of the insulating film pattern 14P may have been removed, and the insulating film 14 may have a portion thinner in thickness than the insulating film pattern 14P.

As illustrated in FIG. 4L, the outer surface of the insulating film pattern 14P may be circular as may be the outer surface of the emission stacked pattern 10. The outer surface 14a of the insulating film 14 may have an elliptical shape that is different from the shape of the outer surface 10a of the emission stacked pattern 10 of FIG. 1A.

Figure 4N:
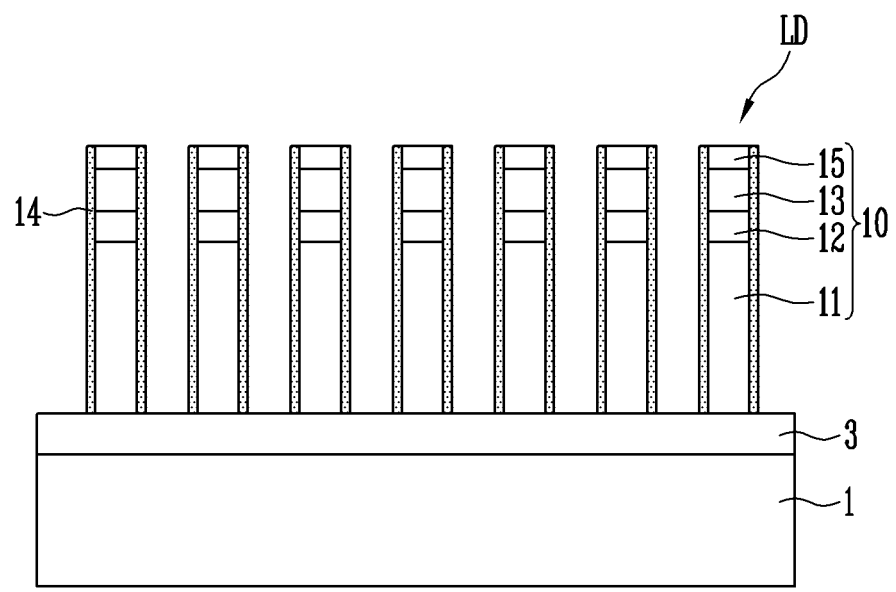
Figure 40:
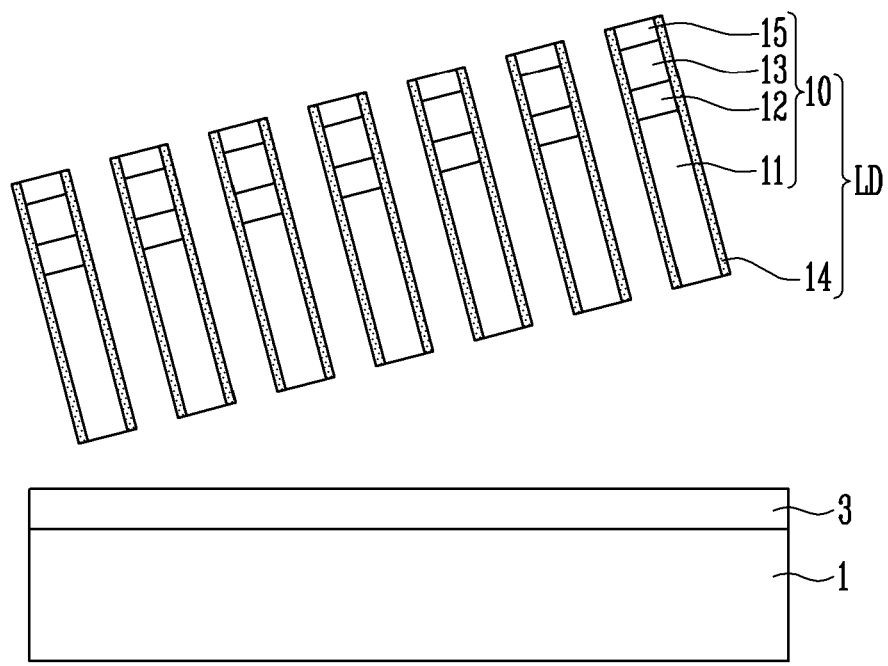

As illustrated in FIG. 4N, the second micro patterns MP2 may be removed to form the light emitting elements LD including the emission stacked patterns 10 surrounded by the insulating films 14.

Subsequently, as illustrated in FIG. 4O, the light emitting elements LD are separated from the substrate 1. For example, the light emitting elements LD may be separated from the substrate 1 using a chemical lift-off (CLO) method. The sacrificial layer 3 may be removed to separate the light emitting elements LD from the substrate 1.

The method of manufacturing the light emitting element according to an embodiment may form the emission stacked patterns 10 using the first micro pattern MP1, and may form the insulating film 14 by selectively removing the insulating film pattern 14P that surrounds the outer surface of the emission stacked pattern 10 using the second micro pattern MP2 different from the first micro pattern MP1.

Hereinafter, light emitting elements according to an embodiment will be described with reference to the accompanying drawings.

Figure 8A:
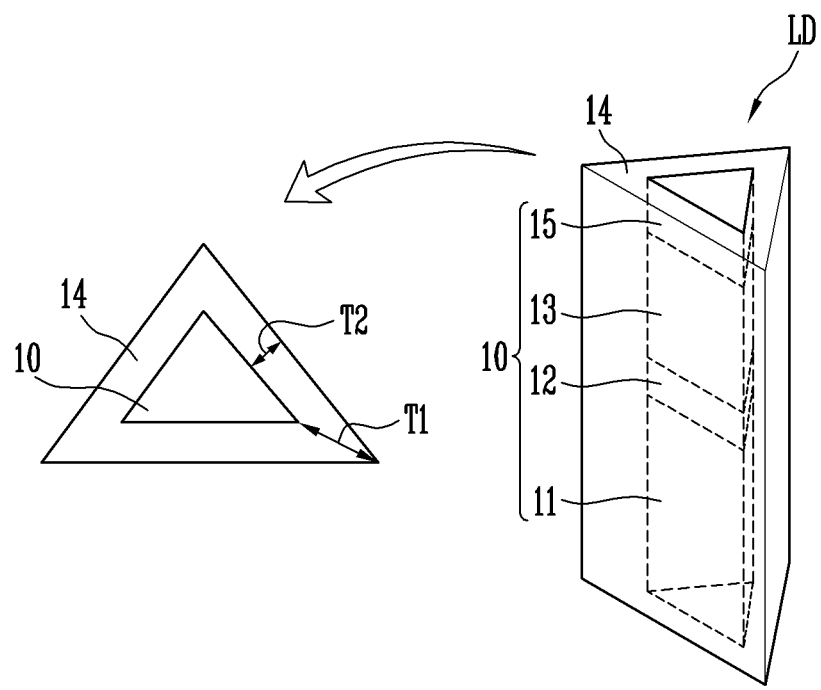
FIGS. 8A and 8B are schematic perspective views of a light emitting element according to an embodiment.
Figure 8B:
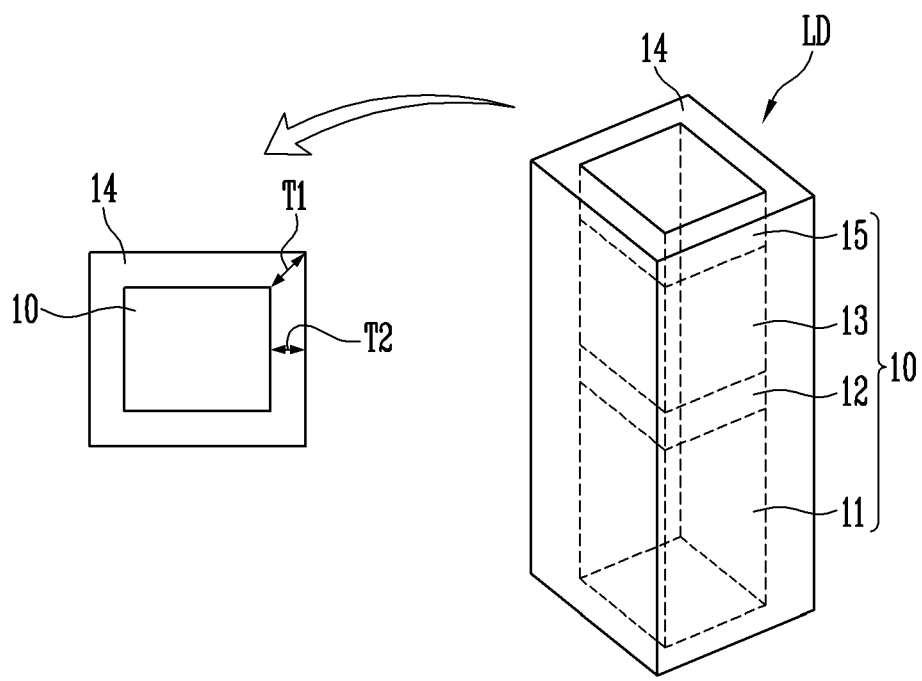

FIGS. 8A and 8B are schematic perspective views of a light emitting element according to an embodiment.

As illustrated in FIGS. 8A and 8B, the light emitting element LD according to an embodiment may be configured such that the outer surface 10a of the emission stacked pattern 10 and the outer surface 14a of the insulating film 14 have the same shape, which may be a shape other than a circular shape.

For example, as illustrated in FIGS. 8A and 8B, the outer surface of the emission stacked pattern 10 and the outer surface of the insulating film 14 may have the same polygonal shape. In the drawings, it is illustrated that both the outer surface of the emission stacked pattern 10 and the outer surface of the insulating film 14 have a triangular shape or a rectangular shape. In this case, the thickness of the insulating film 14 surrounding the outer surface of the emission stacked pattern 10 may not be uniform. The insulating film 14 may include a first thickness T1 that is relatively thick and a second thickness T2 that is relatively thin.

The light emitting element LD according to an embodiment may use the second mold M2 of FIGS. 6B, 7A to 7G (or a similar mold) to form emission stacked patterns 10 having an outer surface with a shape other than a circular shape. The insulating film 14 that surrounds the outer surface of the emission stacked pattern 10 may have the same outer surface shape as the emission stacked pattern 10.

Hereinafter, a display device including a light emitting element according to an embodiment will be described in detail with reference to the accompanying drawings.

Figure 9:
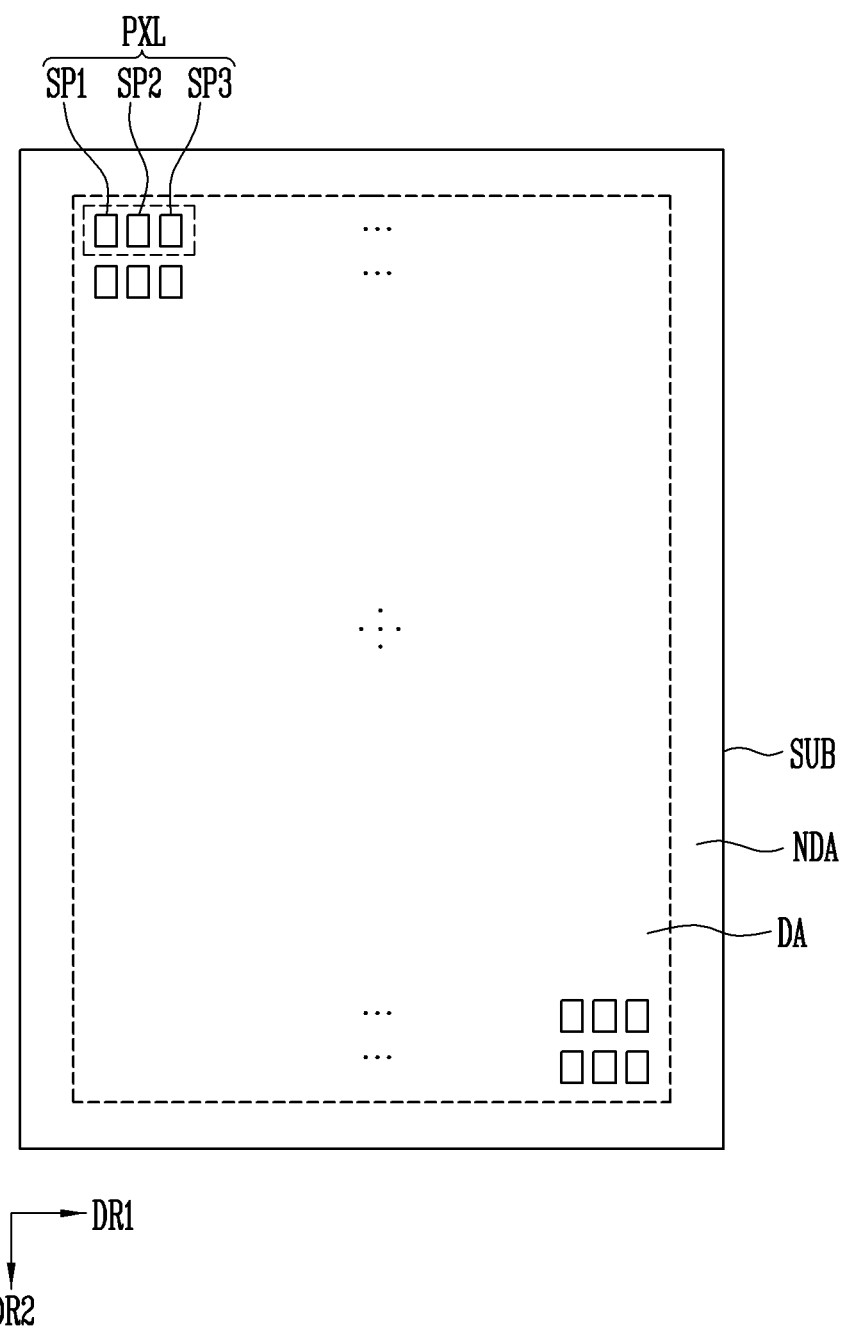
FIG. 9 is a schematic plan view illustrating a display device according to an embodiment, in which the display device uses the light emitting element shown in FIG. 1A as a light emitting source.

FIG. 9 is a schematic plan view illustrating a display device according to an embodiment, in which the display device uses the light emitting element LD shown in FIG. 1A as a light emitting source.

FIG. 9 schematically illustrates the structure of the display device, focused on a display area on which an image is displayed. In an embodiment, although not illustrated, at least one driving circuit (e.g., a scan driver and a data driver) and/or signal lines may be further provided in the display device.

Referring to FIGS. 1A and 9, the display device according to an embodiment may include a substrate SUB, pixels PXL provided on the substrate SUB and including at least one light emitting element LD (FIG. 1A), a driver (not shown) provided on the substrate SUB and driving the pixels PXL, and a line component (not shown) electrically connecting the pixels PXL with the driver.

The display device may be classified into a passive-matrix type display device or an active-matrix type display device according to a method of driving the light emitting element LD (FIG. 1A). In the case where the display device is implemented as an active-matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have become the mainstream. However, the embodiments are not limited thereto. For example, passive-matrix type display devices in which pixels PXL may be turned on by groups may also employ components (e.g., first and second electrodes) for driving the light emitting element LD (refer to FIG. 1A).

The substrate SUB may include a display area DA and a non-display area NDA. The display area DA may be an area in which the pixels PXL for displaying an image are provided. The non-display area NDA may be an area in which the driver for driving the pixels PXL and a portion of the line components for coupling the pixels PXL to the driver are provided.

In the drawings, it is illustrated that the display area DA may be disposed in a central portion of the display device, and the non-display area NDA may be disposed in a perimeter portion of the display device in such a way as to enclose the display area DA. However, the embodiments are not limited thereto, and the positions may be changed.

The display area DA may have various shapes. For example, the display area DA may be provided in forms such as a closed polygon including sides formed of linear lines, a circle, an ellipse or the like including a side formed of a curved line, and a semicircle, a semi-ellipse or the like including sides formed of a linear line and a curved line. The non-display area NDA may be provided on at least one side of the display area DA. In the drawing, it is illustrated that the non-display area NDA surrounds the display area DA, but the embodiments are not limited thereto.

The substrate SUB may be a rigid or flexible substrate but the embodiments are not limited thereto. For example, the substrate SUB may be a rigid substrate made of glass or reinforced glass, or a flexible substrate formed of a thin film made of plastic or metal. Furthermore, the substrate SUB may be a transparent substrate, but the embodiments are not limited thereto. Furthermore, the substrate SUB may be a translucent substrate, an opaque substrate, or a reflective substrate.

The pixels PXL may be provided in the display area DA on the substrate SUB. Each of the pixels PXL refer to a minimum unit for displaying an image, and multiple pixels may be provided.

Each of the pixels PXL may include a light emitting element LD, illustrated in FIG. 1A, configured to be driven in response to a scan signal and a data signal. The light emitting element LD may have a small size in the range from a nanometer scale to a micrometer scale, and may be connected in parallel to adjacent light emitting elements LD. The light emitting elements LD may form a light source of each pixel PXL.

Each of the pixels PXL may include a plurality of sub-pixels. For example, each pixel PXL may include a first sub-pixel SP1, a second sub-pixel SP2, and a third sub-pixel SP3, which emit light of different colors. For instance, the first sub-pixel SP1 may be a red sub-pixel for emitting red light, the second sub-pixel SP2 may be a green sub-pixel for emitting green light, and the third sub-pixel SP3 may be a blue sub-pixel for emitting blue light. However, the embodiments are not limited by the color, type and/or number of the sub-pixels forming each pixel PXL.

FIG. 9 illustrates that the pixels PXL are arranged in the display area DA in a matrix form in a first direction DR1 and a second direction DR2 different from the first direction DR1. However, the embodiments are not limited by the arrangement of the pixels PXL and various arrangements are possible. The arrangement of the sub-pixels of each pixel PXL may also be changed in various ways.

The driver may provide a driving signal to each pixel PXL through the line component and thus control the operation of each pixel PXL. In FIG. 9, the line component is omitted.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

Figure 10A:
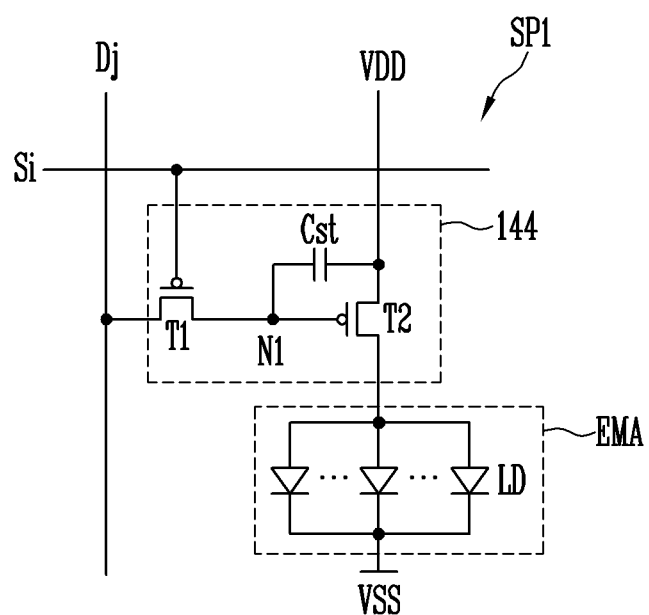
FIGS. 10A to 10C are circuit diagrams illustrating embodiments of a emission area of the display device of FIG. 9.
Figure 10B:
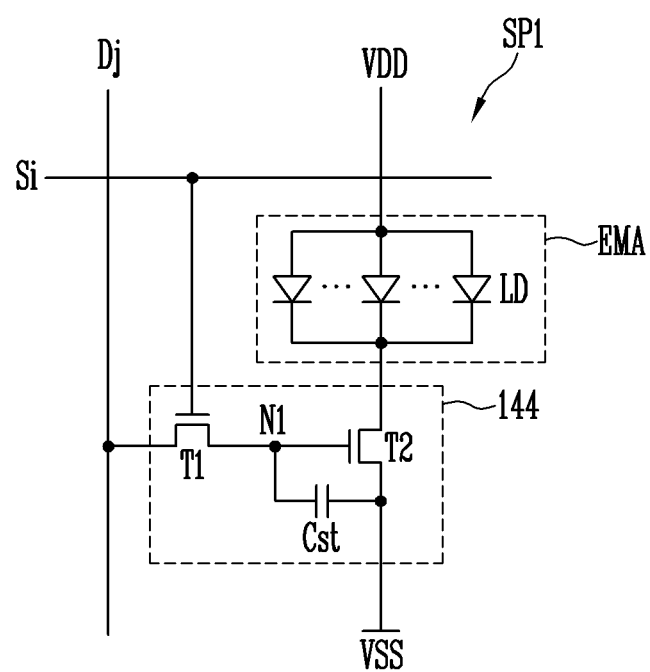
Figure 10C:
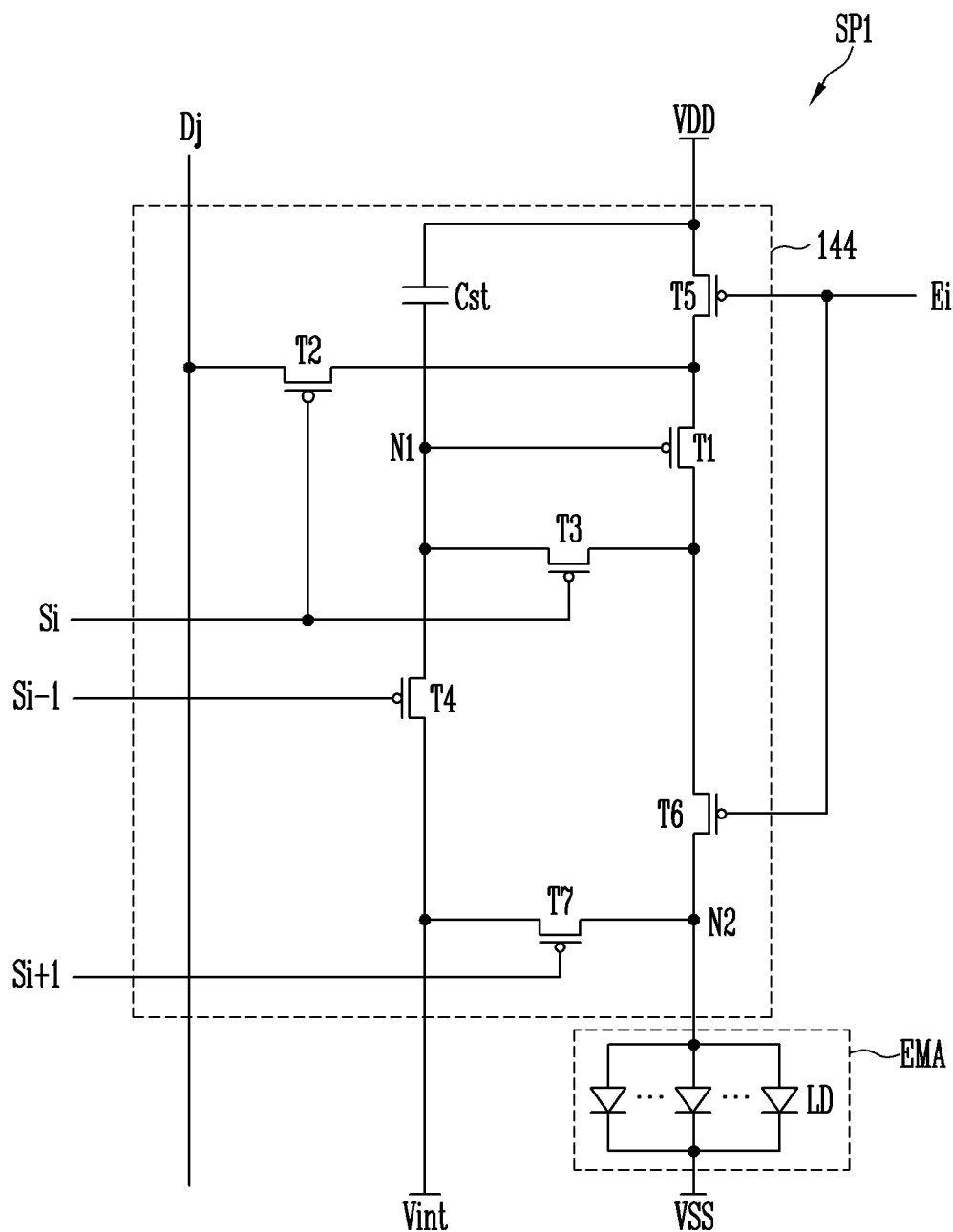

FIGS. 10A to 10C are circuit diagrams illustrating embodiments of an emission area of the display device of FIG. 9.

In FIGS. 10A to 10C, each of the first to third sub-pixels may be configured as an active pixel. However, the embodiments are not limited by the type, structure and/or driving method of each of the sub-pixels. For example, each of the first to third sub-pixels may be configured as a pixel of a passive or active display device.

In FIGS. 10A to 10C, the first to third sub-pixels may have substantially the same or similar structures. Hereinafter, for convenience, the first sub-pixel SP1 will be used to describe the embodiments.

Referring to FIGS. 1A, 9, and 10A, the first sub-pixel SP1 may include an emission area EMA that generates light of a luminance corresponding to a data signal and a pixel driving circuit 144 that drives the emission area EMA.

In an embodiment, the emission area EMA may include a plurality of light emitting elements LD connected in parallel between a first driving power supply VDD and a second driving power supply VSS. The first driving power supply VDD and the second driving power supply VSS may have different potentials. For example, the first driving power supply VDD may be set as a high-potential power supply, and the second driving power supply VSS may be set as a low-potential power supply. A difference in potential between the first and second power supplies VDD and VSS may be set to a threshold voltage of the light emitting elements LD or higher during a light emitting period of the first sub-pixel SP1.

A first electrode (e.g., an anode electrode) of each of the light emitting elements LD may be connected to a first driving power supply VDD via the pixel driving circuit 144, and a second electrode (e.g., a cathode electrode) of each of the light emitting elements LD may be connected to a second driving power supply VSS. Therefore, each of the light emitting elements LD may emit light at a luminance corresponding to driving current which is controlled by the pixel driving circuit 144.

Although FIGS. 10A to 10C illustrate embodiments in which the light emitting elements LD are connected in parallel to each other in the same direction (e.g., forward direction) between the first and second driving power supplies VDD and VSS, the embodiments are not limited thereto. For example, in an embodiment, some of the light emitting elements LD may be connected to each other in the forward direction between the first and second driving power supplies VDD and VSS, and the other light emitting elements LD may be connected to each other in the reverse direction. One of the first and second driving power supplies VDD and VSS may be supplied in the form of AC voltage. In this case, the light emitting elements LD may alternately emit light by each group having the same connecting direction. Alternatively, in an embodiment, the first sub-pixel SP1 may include only a single light emitting element LD.

The pixel driving circuit 144 may include a first transistor T1, a second transistor T2, and a storage capacitor Cst. However, the embodiments are not limited to the structure of the pixel driving circuit 144 illustrated in FIG. 10A.

A first electrode of the first transistor (switching transistor) T1 may be connected to a data line Dj, and a second electrode thereof is connected to the first node N1. The first electrode and the second electrode of the first transistor T1 may be different electrodes. For example, if the first electrode is a source electrode, the second electrode may be a drain electrode. A gate electrode of the first transistor T1 may be connected to the scan line Si.

When a scan signal having a voltage (e.g., a low-level voltage) capable of turning on the first transistor T1 is supplied from the scan line Si, the first transistor may be turned on to electrically connect the data line Dj with the first node N1. A data signal of a corresponding frame may be supplied to the data line Dj, whereby the data signal is transmitted to the first node N1. The data signal transmitted to the first node N1 may be charged in the storage capacitor Cst.

The first electrode of the second transistor T2 (driving transistor) may be connected to the first driving power supply VDD, and the second electrode may be electrically connected to the first electrode of each of the light emitting elements LD. A gate electrode of the second transistor T2 may be connected to a first node N1. The second transistor T2 may control the amount of driving current to be supplied to the light emitting elements LD in response to the voltage of the first node N1.

An electrode of the storage capacitor Cst may be connected to the first driving power supply VDD, and the other electrode is connected to the first node N1. The storage capacitor Cst charges a voltage corresponding to the data signal supplied to the first node N1, and maintains the charged voltage until a data signal of a subsequent frame is supplied.

FIG. 10A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting element LD.

However, the embodiments are not limited thereto, and the structure of the pixel driving circuit 144 may be changed in various ways. For example, the pixel driving circuit 144 may further include at least one transistor element such as a transistor element configured to compensate for the threshold voltage of the second transistor T2, a transistor element configured to initialize the first node N1, and/or a transistor element configured to control the emission time of the light emitting elements LD, or other circuit elements such as a boosting capacitor for boosting the voltage of the first node N1.

Furthermore, although the transistors, e.g., the first and second transistors T1 and T2, included in the pixel driving circuit 144 in FIG. 10A have been illustrated as being formed of P-type transistors, the embodiments are not limited to this. At least one of the first and second transistors T1 and T2 included in the pixel driving circuit 144 may be changed to an N-type transistor.

Referring to FIGS. 1A, 9, and 10B, the first and second transistors T1 and T2 according to an embodiment may be formed of N-type transistors. The configuration and operation of the pixel driving circuit 144 illustrated in FIG. 10B, other than a change in connection positions of some components due to a change in the type of transistor, are similar to those of the pixel driving circuit 144 of FIG. 10A. Therefore, detailed descriptions pertaining to this will be omitted.

The embodiments are not limited to the configurations of the pixel driving circuits 144 illustrated in FIGS. 10A and 10B. For example, the pixel driving circuit 144 may be configured as shown in FIG. 10C.

Referring to FIGS. 1A, 9, and 10C, the pixel driving circuit 144 may be coupled to the scan line Si and the data line Dj of the first sub-pixel SP1. For example, if the first sub-pixel SP1 is disposed on an i-th row and a j-th column of the display area DA, the pixel driving circuit 144 of the first sub-pixel SP1 may be coupled to an i-th scan line Si and a j-th data line Dj of the display area DA.

In an embodiment, the pixel driving circuit 144 may also be coupled to at least one different scan line. For example, the first sub-pixel SP1 disposed on the i-th row of the display area DA may also be coupled to an i−1-th scan line Si−1 and/or an i+1-th scan line Si+1.

In an embodiment, the pixel driving circuit 144 may be coupled not only to the first and second driving power supplies VDD and VSS but also to a third power supply. For example, the pixel driving circuit 144 may also be coupled to an initialization power supply Vint.

The pixel driving circuit 144 may include first to seventh transistors T1 to T7, and a storage capacitor Cst.

The first transistor (driving transistor) T1 may include a first electrode, e.g., a source electrode, connected to the first driving power supply VDD via the fifth transistor T5, and a second electrode, e.g., a drain electrode, connected to first ends of light emitting elements LD via the sixth transistor T6. A gate electrode of the first transistor T1 may be connected to a first node N1. The first transistor T1 may control the driving current flowing between the first driving power supply VDD and the second driving power supply VSS via the light emitting elements LD in response to the voltage of the first node N1.

The second transistor (switching transistor) T2 may be connected between the j-th data line Dj coupled to the first sub-pixel SP1 and the source electrode of the first transistor T1. A gate electrode of the second transistor T2 may be connected to the i-th scan line Si coupled to the first sub-pixel SP1. When a scan signal having a gate-on voltage (e.g., a low-level voltage) is supplied from the i-th scan line Si, the second transistor T2 may be turned on to electrically connect the j-th data line Dj to the source electrode of the first transistor T1. Hence, if the second transistor T2 is turned on, a data signal supplied from the j-th data line Dj may be transmitted to the first transistor T1.

The third transistor T3 may be connected between the drain electrode of the first transistor T1 and the first node N1. A gate electrode of the third transistor T3 may be connected to the i-th scan line Si. When a scan signal having a gate-on voltage is supplied from the i-th scan line Si, the third transistor T3 may be turned on to electrically connect the drain electrode of the first transistor T1 to the first node N1. Therefore, when the third transistor T3 is turned on, the first transistor T1 may be connected in the form of a diode.

The fourth transistor T4 may be connected between the first node N1 and the initialization power supply Vint. A gate electrode of the fourth transistor T4 may be connected to a preceding scan line, e.g., an i−1-th scan line Si−1. When a scan signal of a gate-on voltage is supplied to the i−1-th scan line Si−1, the fourth transistor T4 may be turned on so that the voltage of the initialization power supply Vint is transmitted to the first node N1. Here, the initialization power supply Vint may have a voltage equal to or less than the minimum voltage of the data signal.

The fifth transistor T5 may be connected between the first driving power supply VDD and the first transistor T1. A gate electrode of the fifth transistor T5 may be connected to a corresponding emission control line, e.g., an i-th emission control line Ei. The fifth transistor T5 may be turned off when an emission control signal having a gate-off voltage is supplied to the i-th emission control line Ei, and is turned on in other cases.

The sixth transistor T6 may be connected between the first transistor T1 and first ends of the light emitting elements LD. A gate electrode of the sixth transistor T6 is connected to the i-th emission control line Ei. The sixth transistor T6 may be turned off when an emission control signal having a gate-off voltage is supplied to the i-th emission control line Ei, and is turned on in other cases.

The seventh transistor T7 may be connected between the first ends of the light emitting elements LD and the initialization power supply Vint. A gate electrode of the seventh transistor T7 may be connected to any one of scan lines of a subsequent stage, e.g., to the i+1-th scan line Si+1. When a scan signal having a gate-on voltage is supplied to the i+1-th scan line Si+1, the seventh transistor T7 may be turned on so that the voltage of the initialization power supply Vint is supplied to the first ends of light emitting elements LD.

The storage capacitor Cst may be connected between the first driving power supply VDD and the first node N1. The storage capacitor Cst may store a voltage corresponding both to the data signal supplied to the first node N1 during each frame period and to the threshold voltage of the first transistor T1.

All of the first to seventh transistors T1 to T7 are illustrated in FIG. 10C as the P-type transistor, but the embodiments are not limited thereto. For example, at least one of the first to seventh transistors T1 to T7 included in the pixel driving circuit 144 may be changed to the N-type transistor, or all of the first to seventh transistors T1 to T7 may be changed to the N-type transistor.

Hereinafter, the pixel of the display device of FIG. 9 will be described in detail with reference to the accompanying drawings.

Figure 11:
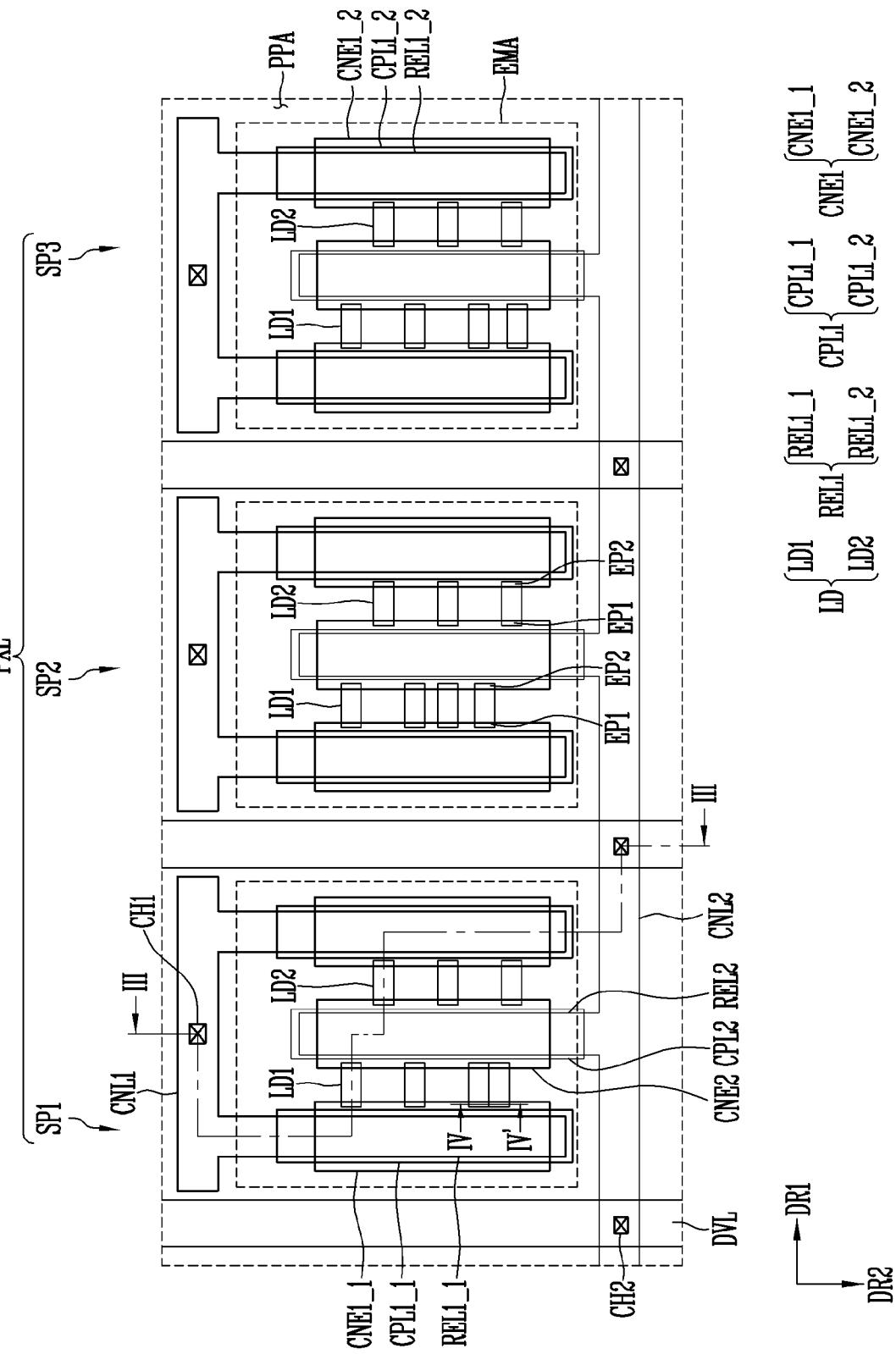
FIG. 11 is a schematic plan view illustrating first to third sub-pixels included in one pixel among pixels shown in FIG. 9.
Figure 12A:
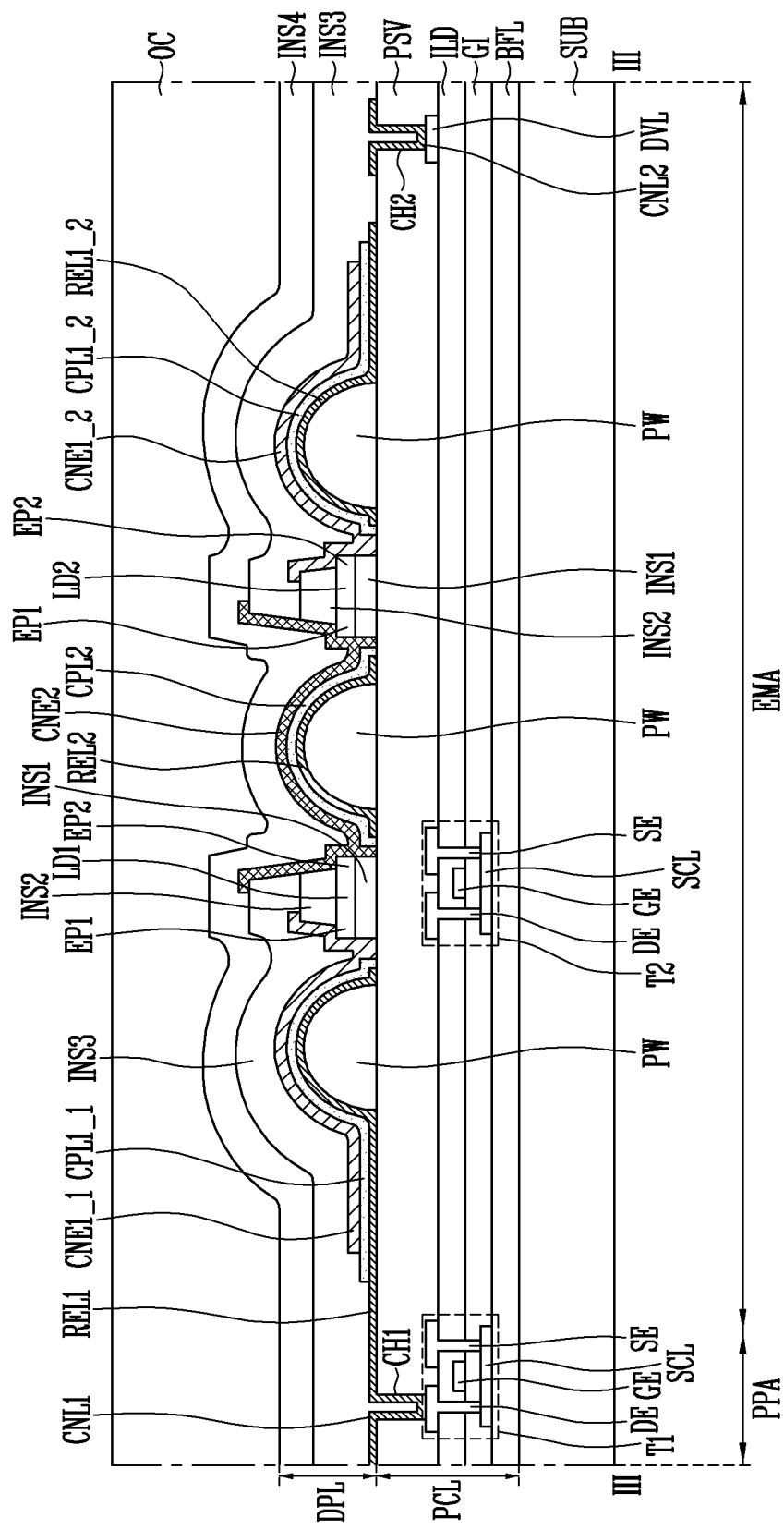
FIG. 12A is a schematic cross-sectional view taken along line of FIG. 11.

FIG. 11 is a schematic plan view illustrating first to third sub-pixels included in one of the pixels shown in FIG. 9. FIG. 12A is a schematic cross-sectional view taken along line of FIG. 11, and FIG. 12B is a schematic cross-sectional view taken along line IV-IV' of FIG. 11.

The transistor coupled to the light emitting elements LD and the signal lines coupled to the transistor are omitted in FIG. 11. In FIGS. 11, 12A and 12B a single pixel structure is simplified, for example, each electrode is illustrated as only a single electrode layer, but the embodiments are not limited thereto.

Figure 12B:
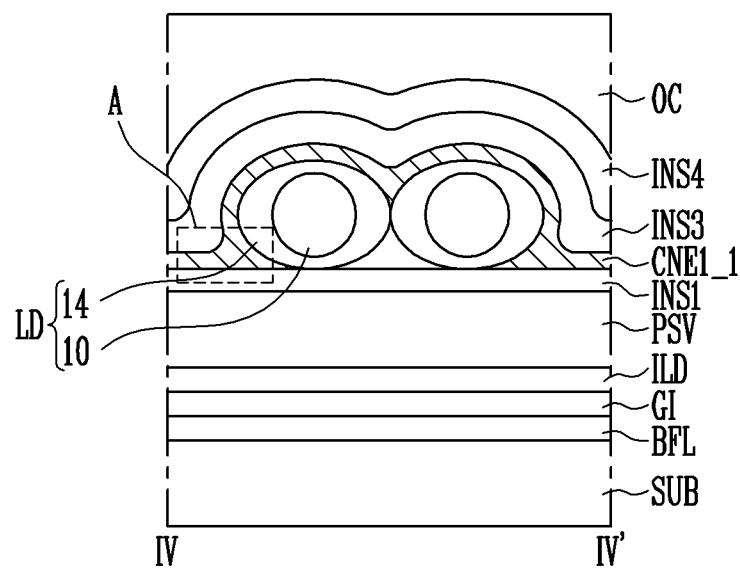
FIG. 12B is a schematic cross-sectional view taken along line IV-IV' of FIG. 11.

As illustrated in FIGS. 11, 12A, and 12B, a pixel PXL may include first to third sub-pixels SP1 to SP3. Each of the first to third sub-pixels SP1 to SP3 may include an emission area EMA that emits light, and a peripheral area PPA that is positioned around the emission area EMA.

Each of the first to third sub-pixels SP1 to SP3 may include a pixel circuit layer PCL disposed on the substrate SUB, and a display element layer DPL disposed on the pixel circuit layer PCL.

The pixel circuit layer PCL of each of the first to third sub-pixels SP1 to SP3 may include a buffer layer BFL disposed on the substrate SUB, first and second transistors T1 and T2 disposed on the buffer layer BFL, a driving voltage line DVL, and a passivation layer PSV provided on the first and second transistors T1 and T2 and the driving voltage line DVL.

The substrate SUB may include an insulating material such as glass, an organic polymer, or crystal. Furthermore, the substrate SUB may be made of a material having flexibility so as to be bendable or foldable, and have a single-layer or multi-layer structure.

The buffer layer BFL may be provided on the substrate SUB and prevent impurities from diffusing into the first or second transistor T1 or T2. The buffer layer BFL may be omitted depending on the material of the substrate SUB or processing conditions.

The first transistor T1 may be a driving transistor that is electrically connected to some of the light emitting elements LD provided on the display element layer DPL of a corresponding sub-pixel to drive the light emitting elements LD, and the second transistor T2 may be a switching transistor that switches the first transistor T1.

Each of the first and second transistors T1 and T2 may include a semiconductor layer SCL, a gate electrode GE, a source electrode SE, and a drain electrode DE.

The semiconductor layer SCL may be disposed on the buffer layer BFL. The semiconductor layer SCL may include a source area which comes into contact with the source electrode SE, and a drain area which comes into contact with the drain electrode DE. An area between the source area and the drain area may be a channel area.

The semiconductor layer SCL may be a semiconductor pattern formed of polysilicon, amorphous silicon, an oxide semiconductor, etc. The channel area may be an intrinsic semiconductor, which is a semiconductor pattern which is not doped with impurities. Each of the source area and the drain area may be a semiconductor pattern doped with impurities.

The gate electrode GE may be provided on the semiconductor layer SCL with a gate insulating layer GI interposed therebetween. Moreover, the source electrode SE and the drain electrode DE may respectively come into contact with the source area and the drain area of the semiconductor layer SCL through corresponding contact holes which pass through an interlayer insulating layer ILD and the gate insulating layer GI.

The driving voltage line DVL may be provided on the interlayer insulating layer ILD, but the embodiments are not limited thereto. In an embodiment, the driving voltage line may be provided on any one of insulating layers included in the pixel circuit layer PCL. The second driving power supply VSS (refer to FIG. 10A) may be applied to the driving voltage line DVL.

The passivation layer PSV may include a first contact hole CH1 that exposes a portion of the drain electrode DE of the first transistor T1, and a second contact hole CH2 that exposes a portion of the driving voltage line DVL.

The display element layer DPL of each of the first to third sub-pixels SP1 to SP3 may include a partition wall PW provided on the passivation layer PSV, first and second electrodes REL1 and REL2, first and second coupling lines CNL1 and CNL2, light emitting elements LD, and first and second contact electrodes CNE1 and CNE2.

The partition wall PW may be provided on the passivation layer PSV in the emission area EMA of each of the first to third sub-pixels SP1 to SP3. Although not illustrated in the drawings, a pixel defining layer (or dam portion) made of the same material as the partition wall PW may be disposed in the peripheral area PPA between adjacent sub-pixels to define the emission area EMA of each sub-pixel.

The partition wall PW may be spaced apart from the adjacent partition wall PW on the passivation layer PSV by a predetermined distance. Two adjacent partition walls PW may be disposed on the passivation layer PSV, and the partition walls PW may be spaced apart from each other by a distance equal to or greater than the length L (refer to FIG. 1A) of a light emitting element LD. As illustrated in FIG. 12A, the partition wall PW may include a curved surface having a semicircle or a semi-ellipse cross-section where the width becomes narrower from the surface of the passivation layer PSV toward the top, but the embodiments are not limited thereto. For example, the partition wall PW may have a trapezoid cross-section where the width becomes narrower from the surface of the passivation layer PSV toward the top.

The embodiments are not limited by the shape of the partition wall PW, and the shape of the partition wall PW may change as long as they are capable of improving the efficiency of light emitted from each of the light emitting elements LD. Two adjacent partition walls PW may be disposed on the same plane of the passivation layer PSV, and may have the same height.

The light emitting elements LD may be disposed in the emission area EMA of each of the first to third sub-pixels SP1 to SP3. The light emitting elements LD may be disposed on the first insulating layer INS1 disposed between adjacent partition walls PW.

Each of the light emitting elements LD may be a light emitting element LD of FIG. 1A which is made of material having an inorganic crystal structure and has a subminiature size, e.g., a size in the range from a nanometer scale to a micrometer scale.

Each of the light emitting elements LD may include an emission stacked pattern 10 formed by sequentially stacking a first conductive semiconductor layer 11, an active layer 12, a second conductive semiconductor layer 13, and an electrode layer 15 in the longitudinal direction L (refer to FIG. 1A) of each light emitting element LD, and an insulating film 14 surrounding an outer surface 10a of the emission stacked pattern 10.

In the drawings, the insulating film 14 is disposed to completely surround the outer surface of the emission stacked pattern 10. However, the insulating film 14 may be disposed to expose a portion of the outer surface 10a of the emission stacked pattern 10. The insulating film 14 may be disposed to completely surround the active layer 12, and may expose portions of the first conductive semiconductor layer 11, the second conductive semiconductor layer 13, and the electrode layer 15.

The thickness of the insulating film 14 may be non-uniform. The insulating film 14 may have an outer surface different from the outer surface of the emission stacked pattern 10. For example, the outer surface 10a of the emission stacked pattern 10 may have a circular shape, and the outer surface 14a of the insulating film 14 may have an elliptical shape, a polygonal shape, or a shape in which an ellipse and a polygon are mixed. In the drawings, the outer surface 14a of the insulating film 14 has the elliptical shape.

The light emitting element LD may have a first end EP1 and a second end EP2 in the longitudinal direction L (FIG. 1A). For example, the first conductive semiconductor layer 11 may be disposed on the first end EP1 of each light emitting element LD, and the electrode layer 15 may be disposed on the second end EP2.

Furthermore, the first and second ends EP1 and EP2 of the light emitting elements LD may be electrically connected to the first and second electrodes REL1 and REL2. The light emitting elements LD may be arranged horizontally in the first direction DR1 such that each of the ends EP1 and EP2 of each light emitting element LD are connected to the first and second electrodes REL1 and REL2. The light emitting elements LD may be disposed to be spaced apart from each other, or may be disposed to be partially adjacent to each other.

Each of the first and second electrodes REL1 and REL2 may be provided in the emission area EMA of each of the first to third sub-pixels SP1 to SP3, and may extend in a second direction DR2 intersecting the first direction DR1. The first and second electrodes REL1 and REL2 may be provided on the same plane, and may be spaced apart from each other by a predetermined distance.

The first electrode REL1 may include a 1-1-th electrode REL1_1 and a 1-2-th electrode REL1_2 branched along the second direction DR2 from the first coupling line CNL1 extending in the first direction DR1. The 1-1-th electrode REL1_1, the 1-2-th electrode REL1_2, and the first coupling line CNL1 may be integrally provided to be electrically and/or physically connected to each other. The 1-1-th electrode REL1_1 and the 1-2-th electrode REL1_2 may be electrically connected to the 1-1-th contact electrode CNE1_1 and the 1-2-th contact electrode CNE1_2 through a 1-1-th encapsulation layer CPL1_1 and a 1_2-th encapsulation layer CPL1_2, respectively.

The second electrode REL2 may extend in the second direction DR2, and may be electrically connected to the second coupling line CNL2. In an embodiment, the second electrode REL2 may be branched from the second coupling line CNL2 along the second direction DR2. Thus, the second electrode REL2 and the second coupling line CNL2 may be integrally provided to be electrically and/or physically connected to each other. Furthermore, the second electrode REL2 may also be electrically connected to the second contact electrode CNE2 through a second encapsulation layer CPL2.

The 1-1-th encapsulation layer CPL1_1, the 1_2-th encapsulation layer CPL1_2, and the second encapsulation layer CPL2 prevent the first electrode REL1 and the second electrode REL2 from being damaged, in the process of manufacturing the display device. However, the 1-1-th electrode REL1_1 and the 1-2-th electrode REL1_2 may be electrically connected to the 1-1-th contact electrode CNE1_1 and the 1-2-th contact electrode CNE1_2 without the 1-1-th encapsulation layer CPL1_1 and the 1_2-th encapsulation layer CPL1_2. Furthermore, the second electrode REL2 may also be directly connected to the second contact electrode CNE2.

Each of the first and second electrodes REL1 and REL2 may function as an alignment electrode for aligning the light emitting elements LD in the emission area EMA of each of the first to third sub-pixels SP1 to SP3, and may function as a driving electrode for driving the light emitting elements LD after the light emitting elements LD are aligned.

Before the light emitting elements LD are aligned in the emission area EMA of each of the first to third sub-pixels SP1 to SP3, a first alignment voltage may be applied through the first coupling line CNL1 to the first electrode REL1, and a second alignment voltage may be applied through the second coupling line CNL2 to the second electrode REL2. The first alignment voltage and the second alignment voltage may have different voltage levels. As predetermined alignment voltages having different voltage levels are applied to the first electrode REL1 and the second electrode REL2, respectively, an electric field may be formed between the first electrode REL1 and the second electrode REL2. The light emitting elements LD may be aligned on the passivation layer PSV between the first electrode REL1 and the second electrode REL2 by the electric field.

In a plan view, the second electrode REL2 may be provided between the 1-1-th electrode REL1_1 and the 1-2-th electrode REL1_2, and the second electrode REL2 may be spaced apart from the 1-1-th electrode REL1_1 and the 1-2-th electrode REL1_2 by a predetermined distance. The 1-1-th electrode REL1_1, the 1-2-th electrode REL1_2, and the second electrode REL2 may be alternately disposed on the passivation layer PSV.

The first and second electrodes REL1 and REL2 may be made of a material having a predetermined reflectivity to allow light emitted from both ends EP1 and EP2 of the light emitting elements LD to proceed in a direction (e.g., the front direction) in which an image of the display device is displayed.

In an embodiment, the first and second electrodes REL1 and REL2, the first coupling line CNL1, and the second coupling line CNL2 may be provided on the same layer, and may be made of the same material.

Each of the first and second electrodes REL1 and REL2, the first coupling line CNL1, and the second coupling line CNL2 may be made of a conductive material having a predetermined reflectivity. The conductive material may include metal such as Ag, Mg, Al, Pt, Pd, Au, Ni, Nd, Ir, Cr, Ti, or an alloy of such metals, a conductive oxide such as an indium tin oxide (ITO), an indium zinc oxide (IZO), a zinc oxide (ZnO), or an indium tin zinc oxide (ITZO), and a conductive polymer such as PEDOT. The materials of each of the first and second electrodes REL1 and REL2, the first coupling line CNL1, and the second coupling line CNL2 are not limited to these materials.

Although each of the first and second electrodes REL1 and REL2, the first coupling line CNL1, and the second coupling line CNL2 may be formed of a single layer, but the embodiments are not limited thereto. It may have a multi-layer structure formed by stacking two or more layers each including metal, an alloy, a conductive oxide, or a conductive polymer.

Each of the first and second electrodes REL1 and REL2, the first coupling line CNL1, and the second coupling line CNL2 may be formed of a multi-layer structure to minimize a voltage drop due to signal delay when a signal is transmitted to both ends EP1 and EP2 of the light emitting elements LD.

Since the first and second electrodes REL1 and REL2 have a shape corresponding to that of the partition wall PW, light emitted from both ends EP1 and EP2 of each of the light emitting elements LD may be reflected by the first and second electrodes REL1 and REL2 to further proceed to the front of the display device. Therefore, the efficiency of light emitted from each of the light emitting elements LD may be enhanced.

In an embodiment, the partition wall PW and the first and second electrodes REL1 and REL2 may serve as a reflective member that causes light emitted from each of the light emitting elements LD to proceed to the front of the display device, thus improving the light emission efficiency of the light emitting elements LD.

Any one of the first and second electrodes REL1 and REL2 may be an anode electrode, and the other may be a cathode electrode. In an embodiment, the first electrode REL1 may be an anode electrode, and the second electrode REL2 may be a cathode electrode.

In an embodiment, the light emitting elements LD may be divided into the first light emitting elements LD1 aligned between the 1-1-th electrode REL1_1 and the second electrode REL2, and a plurality of second light emitting elements LD2 aligned between the second electrode REL2 and the 1-2-th electrode REL1_2.

In an embodiment, the first coupling line CNL1 may be electrically connected to the drain electrode DE of the first transistor T1 through the first contact hole CH1 of the passivation layer PSV. Since the first coupling line CNL1 is provided integrally with the first electrode REL1, a signal of the first transistor T1 applied to the first coupling line CNL1 may be transmitted to the first electrode REL1.

The first electrode REL1 may be disposed adjacent to one of the ends EP1 and EP2 of the light emitting elements LD, and may be electrically connected to each of the light emitting elements LD through the first contact electrode CNE1. Thus, the signal of the first transistor T1 applied to the first electrode REL1 may be transmitted to each of the light emitting elements LD through the first contact electrode CNE1.

In an embodiment, the second coupling line CNL2 may be electrically connected to the driving voltage line DVL through the second contact hole CH2 of the passivation layer PSV. Since the second coupling line CNL2 is provided integrally with the second electrode REL2, the second driving power supply VSS of the driving voltage line DVL applied to the second coupling line CNL2 may be transmitted to the second electrode REL2.

The second electrode REL2 may be disposed adjacent to a remaining one of the ends EP1 and EP2 of the light emitting elements LD, and may be electrically connected to each of the light emitting elements LD through the second contact electrode CNE2. Thus, the second driving power supply VSS applied to the second electrode REL2 may be transmitted to each of the light emitting elements LD.

A first contact electrode CNE1 may be provided on the first electrode REL1 to stably electrically and/or physically connect the first electrode REL1 and one of the ends EP1 and EP2 of the light emitting elements LD. The first contact electrode CNE1 may be made of a transparent conductive material so that light emitted from each of the light emitting elements LD and reflected to the front of the display device by the first electrode REL1 may proceed to the front without loss.

In a plan view, the first contact electrode CNE1 may cover the first electrode REL1 and overlap with the first electrode REL1. Furthermore, the first contact electrode CNE1 may partially overlap with one of the ends EP1 and EP2 of each of the light emitting elements LD.

In an embodiment, the first contact electrode CNE1 may include a 1-1-th contact electrode CNE1_1 provided on the 1-1-th encapsulation layer CPL1_1, and a 1-2-th contact electrode CNE1_2 provided on the 1-2-th encapsulation layer CPL1_2.

A third insulating layer IN3 may be provided on the first contact electrode CNE1 to cover the first contact electrode CNE1. The third insulating layer IN3 may prevent the first contact electrode CNE1 from being exposed to the outside, thus preventing the first contact electrode CNE1 from being corroded.

The third insulating layer INS3 may include an inorganic insulating layer made of inorganic material or an organic insulating layer made of organic material. Although the third insulating layer INS3 may be formed of a single layer as shown in the drawing, the embodiments are not limited thereto. For example, the third insulating layer INS3 may be formed of a multi-layer structure. When the third insulating layer INS3 is formed of the multi-layer structure, the third insulating layer INS3 may have a structure formed by alternately stacking inorganic insulating layers or organic insulating layers. For example, the third insulating layer INS3 may have a structure formed by sequentially stacking a first inorganic insulating layer, an organic insulating layer, and a second inorganic insulating layer.

A second contact electrode CNE2 may be provided on the second electrode REL2. In a plan view, the second contact electrode CNE2 may cover the second electrode REL2 and overlap with the second electrode REL2. Furthermore, the second contact electrode CNE2 may overlap with the second end EP2 of each of the first light emitting elements LD1 and the first end EP1 of each of the second light emitting elements LD2. The second contact electrode CNE2 may be made of the same material as that of the first contact electrode CNE1, but the embodiments are not limited thereto.

A fourth insulating layer IN4 may be provided on the second contact electrode CNE2 to cover the second contact electrode CNE2. The fourth insulating layer IN4 may prevent the second contact electrode CNE2 from being exposed to the outside, thus preventing the second contact electrode CNE2 from being corroded. The fourth insulating layer INS4 may be formed of either of an inorganic insulating layer or an organic insulating layer.

An overcoat layer OC may be provided on the fourth insulating layer INS4. The overcoat layer OC may be a planarization layer that reduces steps generated by the partition wall PW disposed under the overcoat layer, the first and second electrodes REL1 and REL2, and the first and second contact electrodes CNE1 and CNE2. The overcoat layer OC may be an encapsulation layer to prevent oxygen and moisture from penetrating into the light emitting elements LD. In an embodiment, the overcoat layer OC may be omitted.

A predetermined voltage may be applied to both ends EP1 and EP2 of the light emitting elements LD through the first electrode REL1 and the second electrode REL2. Thus, each of the light emitting elements LD may emit light while electron-hole pairs are combined in the active layer 12 of each of the light emitting elements LD. Here, the active layer 12 may emit light having a wavelength range of about 400 nm to about 900 nm.

When the light emitting element LD has a cylindrical shape, the cross-section of the light emitting element LD may have a circular shape. The outer surface 14a of the insulating film 14 may have a circular shape. In this case, due to the characteristics of the cylinder, the thickness of each of the first and second contact electrodes CNE1 and CNE2 connected to each of the ends EP1 and EP2 of the light emitting element LD while partially surrounding the ends of the light emitting element LD is not uniform. For example, in an area A (refer to FIGS. 12B, 13A, and 13B) where the light emitting element LD and the first insulating layer INS1 are in contact with each other, the thickness of each of the first and second contact electrodes CNE1 and CNE2 may be reduced or there may be portions that are not partially formed, due to the characteristic of the cylinder.

However, when the outer surface 10a of the emission stacked pattern 10 is different in shape from the outer surface 14a of the insulating film 14 as in the embodiment, the thickness of each of the first and second contact electrodes CNE1 and CNE2 is not reduced even in an area where the light emitting element LD is in contact with the first insulating layer INS1. FIG. 12B illustrates an area A where the 1-1-th contact electrode CNE1_1 and the light emitting element LD come into contact with each other.

Figure 13A:
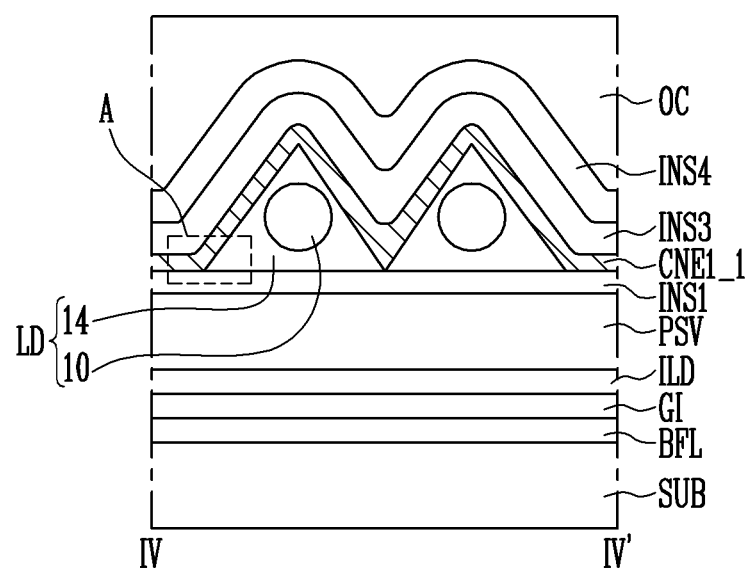
FIGS. 13A and 13B are schematic cross-sectional views taken along line IV-IV' of FIG. 11 including a light emitting element according to an embodiment.
Figure 13B:
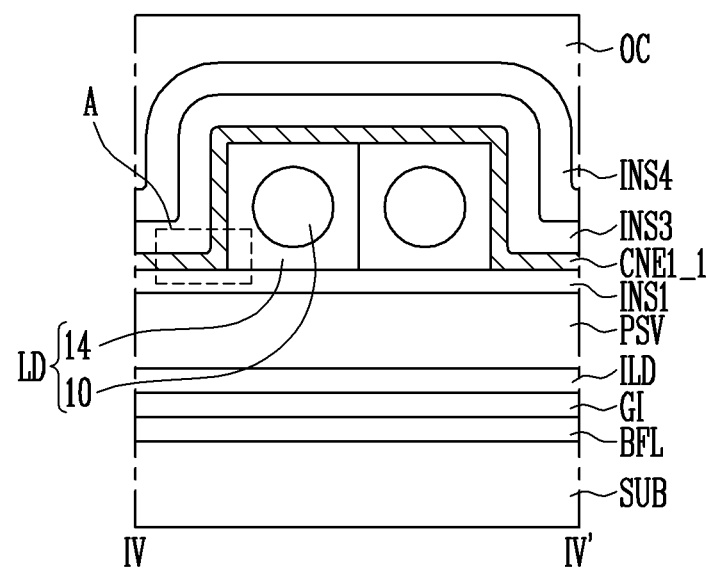

When the outer surface 14a of the insulating film 14 has a polygonal structure, as in FIGS. 13A and 13B, a reduction in thickness of each of the first and second contact electrodes CNE1 and CNE2 can be efficiently prevented in an area A where the light emitting element LD and the first insulating layer INS1 come into contact with each other.

FIGS. 13A and 13B are schematic cross-sectional views taken along line IV-IV' of FIG. 11 including a light emitting element according to an embodiment.

When the outer surface 14a of the insulating film 14 has a triangular shape as illustrated in FIG. 13A or has a rectangular shape as illustrated in FIG. 13B, the first insulating layer INS1 is sufficiently exposed even in the area A where the light emitting element LD is in contact with the first insulating layer INS1. Therefore, the 1-1-th contact electrode CNE1_1 may be formed to have a sufficient thickness in the area A where the light emitting element LD comes into contact with the first insulating layer INS1.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed:

1. A light emitting element comprising:
    an emission stacked pattern having a rod shape, the emission stacked pattern including:
        a first conductive semiconductor layer;
        an active layer disposed on the first conductive semiconductor layer; and
        a second conductive semiconductor layer disposed on the active layer; and
    an insulating film surrounding an outer surface of the emission stacked pattern and having a non-uniform thickness.

2. The light emitting element according to claim 1, wherein a shape of the outer surface of the emission stacked pattern is different from a shape of an outer surface of the insulating film as seen from a perspective facing a distil end of the emission stacked pattern.

3. The light emitting element according to claim 2, wherein
    the emission stacked pattern includes the first conductive semiconductor layer, the active layer, and the second conductive semiconductor layer that are sequentially stacked, and
    the outer surface of the insulating film has an elliptical shape, a polygonal shape, or a shape having the elliptical shape and the polygonal shape.

4. The light emitting element according to claim 3, wherein the insulating film comprises at least one protrusion on the outer surface of the insulating film.

5. The light emitting element according to claim 1, wherein a shape of the outer surface of the emission stacked pattern is same as a shape of an outer surface of the insulating film.

6. The light emitting element according to claim 5, wherein the outer surface of the emission stacked pattern and the outer surface of the insulating film each have a polygonal shape.

7. A method of manufacturing a light emitting element, comprising:
    forming an emission stacked pattern on a substrate, the emission stacked pattern having a rod shape;
    forming an insulating film surrounding an outer surface of the emission stacked pattern, the insulating film having a non-uniform thickness; and
    separating the emission stacked pattern surrounded by the insulating film from the substrate to form light emitting elements.

8. The method according to claim 7, wherein the forming of the insulating film comprises:
    forming an insulating film pattern having an outer surface that has a same shape as a shape of the outer surface of the emission stacked pattern; and
    forming an insulating film having an outer surface that has a different shape from the shape of the outer surface of the emission stacked pattern by removing at least a portion of the insulating film pattern.

9. The method according to claim 7, wherein the forming of the insulating film includes forming the insulating film to have an outer surface having an elliptical shape, a polygonal shape, or a shape having the elliptical shape and the polygonal shape to surround a cylindrical outer surface of the emission stacked pattern.

10. The method according to claim 9, wherein the forming of the insulating film includes forming at least one protrusion on the outer surface of the insulating film.

11. The method according to claim 7, wherein the forming of the emission stacked pattern comprises:
  forming an emission stack by sequentially forming a first conductive semiconductor layer, an active layer, and a second conductive semiconductor layer on the substrate;
  forming first micro patterns on the emission stack; and
  forming a plurality of emission stacked patterns by etching the emission stack along the first micro patterns and removing the first micro patterns.

12. The method according to claim 11, wherein the forming of the first micro patterns comprises:
  forming first resins on the emission stack;
  providing the first resins to fill first grooves of a first mold; and
  forming the first micro patterns on the emission stack by removing the first mold.

13. The method according to claim 8, wherein the forming of the insulating film comprises:
  forming second micro patterns on the emission stacked pattern and the insulating film pattern; and
  forming the insulating film by etching the insulating film pattern along the second micro patterns.

14. The method according to claim 13, wherein the forming of the second micro patterns comprises:
  forming second resins on the emission stacked pattern and the insulating film pattern that surrounds the outer surface of the emission stacked pattern;
  providing the second resins to fill second grooves of a second mold; and
  forming second micro patterns, by removing the second mold, on the emission stacked pattern and the insulating film pattern that surrounds the outer surface of the emission stacked pattern.

15. The method according to claim 14, wherein a shape of the first groove of the first mold is different from a shape of the second groove of the second mold.

16. The method according to claim 7, wherein the forming of the insulating film includes forming the insulating film to have an outer surface that has a same shape as a shape of the outer surface of the emission stacked pattern.

17. The method according to claim 16, wherein the outer surface of the emission stacked pattern and the outer surface of the insulating film have a polygonal shape.

18. A display device, comprising:
  a substrate including a display area and a non-display area; and
  a plurality of pixels disposed in the display area of the substrate, each of the plurality of pixels including a plurality of sub-pixels, respectively, wherein
  each of the plurality of sub-pixels comprises:
    a pixel circuit layer including at least one transistor; and
    a display element layer including an emission area that emits light,
  the display element layer includes:
    at least one light emitting element disposed on the substrate and emitting light;
    a first electrode and a second electrode spaced apart from each other, the at least one light emitting element being disposed between the first electrode and the second electrode;
    a first contact electrode electrically connecting the first electrode and a first end of the at least one light emitting element; and
    a second contact electrode electrically connecting the second electrode and a second end of the at least one light emitting element, and the at least one light emitting element comprises:
      an emission stacked pattern including:
        a first conductive semiconductor layer;
        an active layer disposed on the first conductive semiconductor layer; and
        a second conductive semiconductor layer disposed on the active layer; and
      an insulating film surrounding an outer surface of the emission stacked pattern and having a non-uniform thickness.

19. The display device according to claim 18, wherein a shape of the outer surface of the emission stacked pattern is different from a shape of an outer surface of the insulating film.

* * * * *